(12) United States Patent
Nakamoto

(10) Patent No.: US 12,250,486 B2
(45) Date of Patent: *Mar. 11, 2025

(54) IMAGING APPARATUS AND ELECTRONIC DEVICE

(71) Applicant: Sony Semiconductor Solutions Corporation, Kanagawa (JP)

(72) Inventor: Eiichi Nakamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 131 days.

This patent is subject to a terminal disclaimer.

(21) Appl. No.: 17/926,316

(22) PCT Filed: Jun. 17, 2021

(86) PCT No.: PCT/JP2021/023046
§ 371 (c)(1),
(2) Date: Nov. 18, 2022

(87) PCT Pub. No.: WO2021/261375
PCT Pub. Date: Dec. 30, 2021

(65) Prior Publication Data
US 2023/0254607 A1    Aug. 10, 2023

(30) Foreign Application Priority Data

Jun. 25, 2020 (JP) .................................. 2020-109366

(51) Int. Cl.
*H04N 25/78* (2023.01)
*H04N 25/772* (2023.01)

(52) U.S. Cl.
CPC ........... *H04N 25/78* (2023.01); *H04N 25/772* (2023.01)

(58) Field of Classification Search
CPC .... H04N 25/616; H04N 25/78; H04N 25/772; H04N 25/709; H04N 25/778;
(Continued)

(56) References Cited

U.S. PATENT DOCUMENTS

| 7,994,481 | B2 * | 8/2011 | Yagi | H04N 23/81 |
| | | | | 378/114 |
| 9,762,836 | B2 * | 9/2017 | Kurose | H01L 27/14634 |

(Continued)

FOREIGN PATENT DOCUMENTS

| JP | 2008206971 A | 9/2008 |
| JP | 2019012933 A | 1/2019 |

(Continued)

OTHER PUBLICATIONS

International Search Report (PCT/ISA/210), International Application No. PCT/JP2021/023046, dated Jul. 20, 2021.

*Primary Examiner* — Pritham D Prabhakher
(74) *Attorney, Agent, or Firm* — Michael Best & Friedrich LLP

(57) ABSTRACT

Provided is an imaging apparatus in which a column signal processing system includes a successive approximation register analog-to-digital converter capable of operating at higher speed and with lower power consumption.

An electronic device of the present disclosure includes an imaging apparatus including a pixel array unit on which pixels including a photoelectric conversion element are arranged, a column amplifier unit that obtains a difference between a reset component and a signal component input from each of the pixels of the pixel array unit through a signal line and outputs the difference as a pixel signal, a capacitance unit that holds the pixel signal input from the column amplifier unit, and a successive approximation reg- (Continued)

ister analog-to-digital conversion unit that converts an analog signal input from the capacitance unit into a digital signal.

22 Claims, 20 Drawing Sheets

(58) Field of Classification Search
CPC .... H04N 25/79; H03M 1/466; H03M 1/1295; H03M 1/123; H03M 1/38
USPC .................................................... 348/207.99
See application file for complete search history.

(56) References Cited

U.S. PATENT DOCUMENTS

| | | | | |
|---|---|---|---|---|
| 10,791,293 B2* | 9/2020 | Okura | .................. | H04N 25/772 |
| 10,958,283 B2* | 3/2021 | Hagihara | ................ | H03M 1/46 |
| 11,032,501 B2* | 6/2021 | Stepanovic | .......... | H04N 25/677 |
| 2009/0001276 A1* | 1/2009 | Yagi | .................... | A61B 6/4233 |
| | | | | 348/E5.079 |
| 2015/0189214 A1* | 7/2015 | Kurose | ............. | H01L 27/14634 |
| | | | | 250/208.1 |
| 2018/0240837 A1* | 8/2018 | Chen | ...................... | H04N 3/155 |
| 2019/0007637 A1* | 1/2019 | Nishikido | .............. | H04N 25/62 |
| 2019/0373191 A1* | 12/2019 | Stepanovic | ......... | H03M 1/0673 |
| 2019/0373197 A1* | 12/2019 | Harada | .................. | G02B 23/24 |
| 2020/0029049 A1* | 1/2020 | Okura | .................... | H04N 25/76 |
| 2020/0304136 A1* | 9/2020 | Hagihara | ................ | H03M 1/362 |
| 2021/0037201 A1* | 2/2021 | Tantawy | ................ | H04N 25/78 |

FOREIGN PATENT DOCUMENTS

| | | |
|---|---|---|
| JP | 2019092143 A | 6/2019 |
| WO | 2019198586 A1 | 10/2019 |
| WO | 2020090400 A1 | 5/2020 |

* cited by examiner

TO ANALOG-TO-DIGITAL CONVERSION UNIT

IMAGING APPARATUS AND ELECTRONIC DEVICE

TECHNICAL FIELD

The present disclosure relates to an imaging apparatus and an electronic device.

BACKGROUND ART

The imaging apparatus is equipped with an analog-to-digital converter that converts an analog signal (pixel signal) output from a pixel into a digital signal, and a successive approximation resistor (SAR) analog-to-digital converter is used as the analog-to-digital converter (see, for example, Patent Document 1).

CITATION LIST

Patent Document

Patent Document 1: Japanese Patent Application Laid-Open No. 2019-092143

SUMMARY OF THE INVENTION

Problems to be Solved by the Invention

A successive approximation register analog-to-digital converter is superior to a so-called single-slope analog-to-digital converter in being operable at higher speed and with lower power consumption. A column signal processing system including the successive approximation register analog-to-digital converter is desired to be operated at higher speed and with lower power consumption.

An object of the present disclosure is to provide an imaging apparatus in which a column signal processing system includes a successive approximation register analog-to-digital converter capable of operating at higher speed and with lower power consumption, and an electronic device including the imaging apparatus.

Solutions to Problems

An imaging apparatus of the present disclosure for achieving the object described above includes
a pixel array unit on which pixels including a photoelectric conversion element are arranged,
a column amplifier unit that obtains a difference between a reset component and a signal component input from each of the pixels of the pixel array unit through a signal line and outputs the difference as a pixel signal,
a capacitance unit that holds the pixel signal input from the column amplifier unit, and
a successive approximation register analog-to-digital conversion unit that converts an analog signal input from the capacitance unit into a digital signal.
Furthermore, an electronic device of the present disclosure for achieving the above object includes an imaging apparatus having a configuration described above.

MODE FOR CARRYING OUT THE INVENTION

Figure 1:
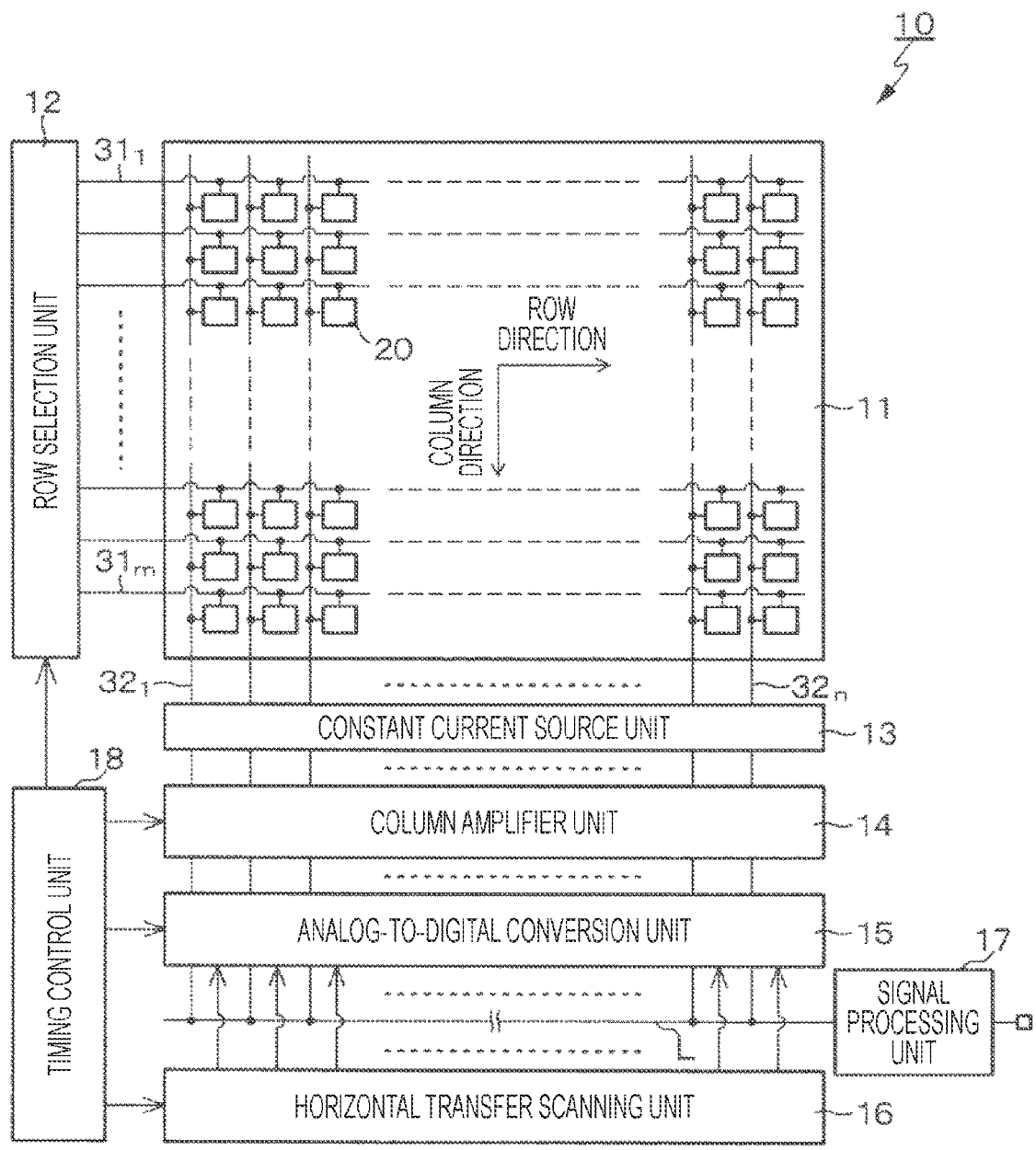
FIG. 1 is a block diagram depicting an outline of a basic configuration of a CMOS image sensor as an example of an imaging apparatus to which the technology according to the present disclosure is applied.

Hereinafter, modes for carrying out the technology according to the present disclosure (hereinafter described as "embodiment") will be described in detail with reference to the drawings. The technology according to the present disclosure is not limited to the embodiments, and various numerical values and the like in the embodiments are examples. In the following description, the same reference signs will be used for the same elements or elements having the same functions, and redundant description will be omitted. Note that the description will be made in the following order.

1. General description of imaging apparatus and electronic device of present disclosure
2. Imaging apparatus to which technology according to present disclosure is applied
2-1. Configuration example of CMOS image sensor
2-2. Example of circuit configuration of pixel
2-3. Semiconductor chip structure
2-3-1. Flat semiconductor chip structure
2-3-2. Stacked semiconductor chip structure
2-4. Single-slope analog-to-digital converter
3. First embodiment of present disclosure (example of CMOS image sensor)
3-1. First embodiment (example of intermittent operation in which successive approximation register analog-to-digital converter performs conversion processing only during P-phase and stands by during D-phase)
3-1-1. Configuration example of column amplifier
3-1-2. Configuration example of capacitance multiplexer
3-1-3. Configuration example of successive approximation register analog-to-digital converter
3-1-4. Circuit operation of column signal processing system
3-2. Second embodiment (modification of first embodiment: example of non-intermittent operation in which successive approximation register analog-to-digital converter performs conversion processing not only during P-phase but also during D-phase)
3-3. Third embodiment (modification of second embodiment: example of evenly using three capacitive elements for potential VSL of two systems of signal lines)
3-3-1. Configuration example of column signal processing system
3-3-2. Circuit operation of column signal processing system
3-4. Fourth embodiment (example in which capacitance multiplexer and subsequent units have a configuration of differential circuit)
3-4-1. Power supply voltage and transistor to be used
3-4-2. Level diagram
3-4-3. Configuration example of column amplifier
3-4-4. Configuration example of successive approximation register analog-to-digital converter
4. Second embodiment of present disclosure (example of indirect TOF distance image sensor)
4-1. Example of system configuration
4-2. Example of circuit configuration of pixel
5. Modification
6. Application example
7. Application example of technology according to present disclosure
7-1. Electronic device of present disclosure (example of imaging apparatus)
7-2. Example of application to mobile body
8. Employable configurations in present disclosure <General Description of Imaging Apparatus and Electronic Device of Present Disclosure>

An imaging apparatus and an electronic device of the present disclosure can have a configuration in which a column amplifier unit includes an amplifier to which a potential of the signal line is input to a non-inverting input terminal, a first switch having one end connected to an output terminal of the amplifier and another end connected to an inverting input terminal of the amplifier, a second switch having one end connected to an output terminal of the amplifier, a first capacitive element having one end connected to another end of the second switch and another end connected to the another end of the first switch and the inverting input terminal of the amplifier, a second capacitive element connected between the another end of the first capacitive element and the inverting input terminal of the amplifier and a base potential node, and a third switch having one end connected to the another end of the second switch and the one end of the first capacitive element, the third switch having another end to which a base voltage is applied.

The imaging apparatus and the electronic device of the present disclosure including the preferred configuration described above can have a configuration in which in the column amplifier unit, when the reset component is input, the first switch is set to a closed state to charge the reset component to the first capacitive element and the second capacitive element, and the third switch is set to a closed state to take in the local base voltage, next, the first switch and the third switch are set to an open state, the second switch is set to a closed state, and a non-inverting amplifier circuit is configured by the first capacitive element, the second capacitive element, and the amplifier, and when the signal component is input, feedback is applied for a voltage at a common connection node between the first capacitive element and the second capacitive element to be identical to a voltage of the signal component.

In addition, the imaging apparatus and the electronic device of the present disclosure including the preferred configuration described above can have a configuration in which, for one successive approximation register analog-to-digital converter of the successive approximation register analog-to-digital conversion unit, potentials of a plurality of the signal lines are each multiplexed and processed through a plurality of column amplifiers corresponding to the plurality of signal lines and the capacitance unit. Furthermore, the successive approximation register analog-to-digital converter can be configured to perform the conversion processing only when the reset component is input and stand by when the signal component is input, or perform the conversion processing not only when the reset component is input but also when the signal component is input.

In addition, in the imaging apparatus and the electronic device of the present disclosure including the preferable configuration described above, the potentials of the plurality of signal lines can be divided into potentials of two systems of signal lines, and the capacitance unit can include three capacitive elements. Then, the three capacitive elements of the capacitance unit can be evenly used for the potentials of two systems of signal lines.

Furthermore, in the imaging apparatus and the electronic device of the present disclosure including the preferable configuration described above, in a column signal processing system including the column amplifier unit, the capacitance unit, and the successive approximation register analog-to-digital conversion unit, the capacitance unit and subsequent portions can have a configuration of a differential circuit. In addition, each of the column amplifiers of the column amplifier unit can include a current reuse column amplifier that performs voltage amplification by using a bias current of each of the signal lines.

Furthermore, in the imaging apparatus and the electronic device of the present disclosure including the preferable configuration described above, the capacitance unit can include a capacitance multiplexer. In addition, the capacitance unit can hold the pixel signal by sampling with a switched capacitor.

<Imaging Apparatus to which Technology According to Present Disclosure is Applied>

First, a basic configuration of an imaging apparatus to which the technology according to the present disclosure is applied will be described. Here, a complementary metal oxide semiconductor (CMOS) image sensor, which is a type of X-Y address imaging apparatus, will be described as an example of the imaging apparatus. The CMOS image sensor is an image sensor manufactured by applying or partially using a CMOS process.

[Configuration Example of CMOS Image Sensor]

FIG. 1 is a block diagram depicting an outline of a basic configuration of a CMOS image sensor as an example of an imaging apparatus to which the technology according to the present disclosure is applied.

A CMOS image sensor 10 of the present example includes a pixel array unit 11 and a peripheral circuit unit of the pixel array unit 11. The pixel array unit 11 is formed by two-dimensionally arranging pixels (pixel circuits) 20 including photoelectric conversion elements in a row direction and a column direction, that is, in a matrix. Here, the row direction refers to an arrangement direction of pixels 20 in a pixel row, and the column direction refers to an arrangement direction of the pixels 20 in a pixel column. The pixels 20 perform photoelectric conversion to generate and accumulate a photoelectric charge corresponding to an amount of received light.

The peripheral circuit unit of the pixel array unit 11 includes, for example, a row selection unit 12, a constant current source unit 13, a column amplifier unit 14, an analog-to-digital conversion unit 15, a horizontal transfer scanning unit 16, a signal processing unit 17, a timing control unit 18, and the like.

In the pixel array unit 11, a pixel control line 31 ($31_1$ to $31_m$) is wired along the row direction for each pixel row with respect to a pixel array in a matrix. Furthermore, a signal line 32 ($32_1$ to $32_n$) is wired along the column direction for each pixel column. The pixel control line 31 transmits a drive signal for performing driving when a signal is read from the pixels 20. In FIG. 1, the pixel control line 31 is illustrated as one wire, but is not limited to one. One end of the pixel control line 31 is connected to an output end corresponding to each row of the row selection unit 12.

Description will be made of each component of the peripheral circuit unit of the pixel array unit 11, that is, the row selection unit 12, the constant current source unit 13, the column amplifier unit 14, the analog-to-digital conversion unit 15, the horizontal transfer scanning unit 16, the signal processing unit 17, the timing control unit 18, and the like.

The row selection unit 12 includes a shift register, an address decoder, and the like, and controls scanning of a pixel row and an address of the pixel row when selecting each pixel 20 of the pixel array unit 11. Although a specific configuration of the row selection unit 12 is not illustrated, the row selection unit 12 generally includes two scanning systems of a read scanning system and a sweep scanning system.

In order to read a pixel signal from the pixel 20, the read scanning system sequentially selects and scans the pixel 20 of the pixel array unit 11 row by row. The pixel signal read from the pixel 20 is an analog signal. The sweep scanning system sweep scans a read row to be read-scanned by the read scanning system prior to the read scanning by a time corresponding to a shutter speed.

By the sweep scanning by the sweep scanning system, unnecessary charges are swept out from the photoelectric conversion elements of the pixels 20 in the read row, and thus the photoelectric conversion elements are reset. Then, by sweeping out (resetting) unnecessary charges by the sweep scanning system, a so-called electronic shutter operation is performed. Here, the electronic shutter operation refers to an operation of discarding photoelectric charges of the photoelectric conversion element and newly starting exposure (starting accumulation of photoelectric charge).

The constant current source unit 13 includes a plurality of load current sources I (see FIG. 2) each including, for example, a MOS transistor and connected to each of the signal lines $32_1$ to $32_n$ for each pixel column, and supplies a bias current to each pixel 20 of the pixel row selectively scanned by the row selection unit 12 through each of the signal lines $32_1$ to $32_n$.

The column amplifier unit 14 includes a set of column amplifiers provided corresponding to each of the signal lines $32_1$ to $32_n$ for each pixel column. Then, each column amplifier of the column amplifier unit 14 amplifies the pixel signal read from each pixel 20 of the pixel array unit 11 and supplied through the signal line $32_1$ to $32_n$, and supplies the amplified pixel signal to the analog-to-digital conversion unit 15.

The analog-to-digital conversion unit 15 is a column-parallel analog-to-digital conversion unit including a set of a plurality of analog-to-digital converters (provided for each pixel column, for example) provided corresponding to the pixel columns of the pixel array unit 11. The analog-to-digital conversion unit 15 converts an analog pixel signal output through each of the signal lines $32_1$ to $32_n$ for each pixel column and amplified by the column amplifier unit 14 into a digital pixel signal.

The horizontal transfer scanning unit 16 includes a shift register, an address decoder, and the like, and controls scanning of a pixel column and an address of the pixel column when a signal of each pixel 20 of the pixel array unit 11 is read. Under the control of the horizontal transfer scanning unit 16, the pixel signal converted into the digital signal by the analog-to-digital conversion unit 15 is read to a horizontal transfer line L in units of pixel columns.

The signal processing unit 17 performs predetermined signal processing on the digital pixel signal supplied through the horizontal transfer line L to generate two-dimensional image data. For example, the signal processing unit 17 performs digital signal processing such as correction of a vertical line defect or a point defect, parallel-to-serial conversion, compression, encoding, addition, averaging, intermittent operation, and the like. The signal processing unit 17 outputs the generated image data to a subsequent device as an output signal of the CMOS image sensor 10.

The timing control unit 18 generates various timing signals, clock signals, control signals, and the like, and performs drive control of the row selection unit 12, the constant current source unit 13, the column amplifier unit 14, the analog-to-digital conversion unit 15, the horizontal transfer scanning unit 16, the signal processing unit 17, and the like on the basis of the generated signals.

[Example of Circuit Configuration of Pixel]

Figure 2:
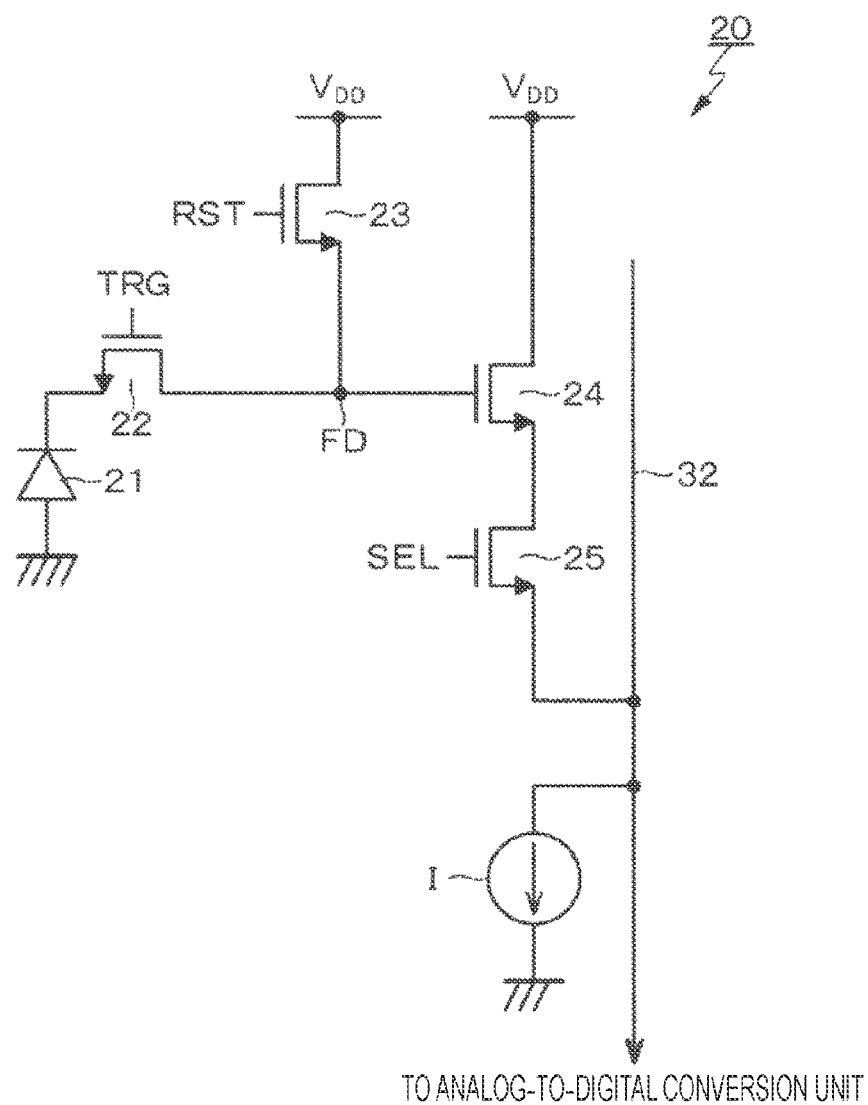
FIG. 2 is a circuit diagram depicting an example of a circuit configuration of a pixel.

FIG. 2 is a circuit diagram depicting an example of a circuit configuration of the pixel (pixel circuit) 20. The pixel 20 includes, for example, a photodiode 21 as a photoelectric conversion element. The pixel 20 includes a transfer transistor 22, a reset transistor 23, an amplification transistor 24, and a selection transistor 25 in addition to the photodiode 21.

Examples of the four transistors of the transfer transistor 22, the reset transistor 23, the amplification transistor 24, and the selection transistor 25 include an N-channel MOS field effect transistor (FET), for example. However, a combination of conductive types of the four transistors 22 to 25 exemplified here is merely an example, and this combination is not necessary.

For the pixel 20, as the above-described pixel control line 31, a plurality of pixel control lines is wired in common to each pixel 20 of the same pixel row. The plurality of pixel control lines is connected to an output end corresponding to each pixel row of the row selection unit 12 in units of pixel rows. The row selection unit 12 appropriately outputs a transfer signal TRG, a reset signal RST, and a selection signal SEL to the plurality of pixel control lines.

The photodiode 21 has an anode electrode connected to a low-potential side power supply (for example, ground), photoelectrically converts received light into photoelectric charge (here, photoelectrons) of a charge amount corresponding to an amount of the light, and accumulates the photoelectric charge. A cathode electrode of the photodiode 21 is electrically connected to a gate of the amplification transistor 24 via the transfer transistor 22. Here, a region where the gate of the amplification transistor 24 is electrically connected is a floating diffusion (floating diffusion region/impurity diffusion region) FD. The floating diffusion FD is a charge-voltage conversion unit that converts a charge into a voltage.

The transfer signal TRG that activates a high level (for example, $V_{DD}$ level) is supplied from the row selection unit 12 to a gate of the transfer transistor 22. The transfer transistor 22 becomes conductive in response to the transfer signal TRG, and transfers the photoelectric charge photoelectrically converted by the photodiode 21 and accumulated in the photodiode 21 to the floating diffusion FD.

The reset transistor 23 is connected between a node of the high-potential side power supply voltage $V_{DD}$ and the floating diffusion FD. The reset signal RST that activates a high level is provided from the row selection unit 12 to a gate of the reset transistor 23. The reset transistor 23 becomes conductive in response to the reset signal RST, and resets the floating diffusion FD by discarding the charge of the floating diffusion FD to the node of the voltage $V_{DD}$.

The amplification transistor 24 has a gate connected to the floating diffusion FD and a drain connected to the node of the high-potential side power supply voltage $V_{DD}$. The amplification transistor 24 serves as an input unit of a source follower that reads a signal obtained by photoelectric conversion in the photodiode 21. That is, a source of the amplification transistor 24 is connected to the signal line 32 via the selection transistor 25. Then, the amplification transistor 24 and the load current source I connected to one end of the signal line 32 constitute a source follower that converts the voltage of the floating diffusion FD into a potential of the signal line 32.

The selection transistor 25 has a drain connected to the source of the amplification transistor 24 and a source connected to the signal line 32. The selection signal SEL that activates a high level is provided from the row selection unit 12 to a gate of the selection transistor 25. The selection transistor 25 becomes conductive in response to the selection signal SEL, and transmits the signal output from the amplification transistor 24 to the signal line 32 with the pixel 20 in a selected state.

Note that, in the circuit example described above, as the circuit configuration of the pixel 20, a 4Tr configuration including the transfer transistor 22, the reset transistor 23, the amplification transistor 24, and the selection transistor 25, that is, including four transistors (Tr) has been described as an example, but this circuit configuration is not necessary. For example, the selection transistor 25 may be omitted, and a 3Tr configuration may be adopted in which the amplification transistor 24 has a function of the selection transistor 25, or a circuit configuration of 5Tr or more may be adopted in which the number of transistors is increased as necessary.

[Semiconductor Chip Structure]

As a semiconductor chip structure of the CMOS image sensor 10 having a configuration described above, a flat semiconductor chip structure and a stacked semiconductor chip structure can be exemplified. In any of the CMOS image sensor 10 having the flat semiconductor chip structure and the stacked semiconductor chip structure, when a substrate surface on a side on which a wiring layer is disposed is a front surface (front face), the pixel 20 can have a back surface irradiation type pixel structure that captures light emitted from a back surface side on an opposite side of the front surface, or can have a front surface irradiation type pixel structure that captures light emitted from a front surface side. Hereinafter, the flat semiconductor chip structure and the stacked semiconductor chip structure will be described.

(Flat Semiconductor Chip Structure)

Figure 3:
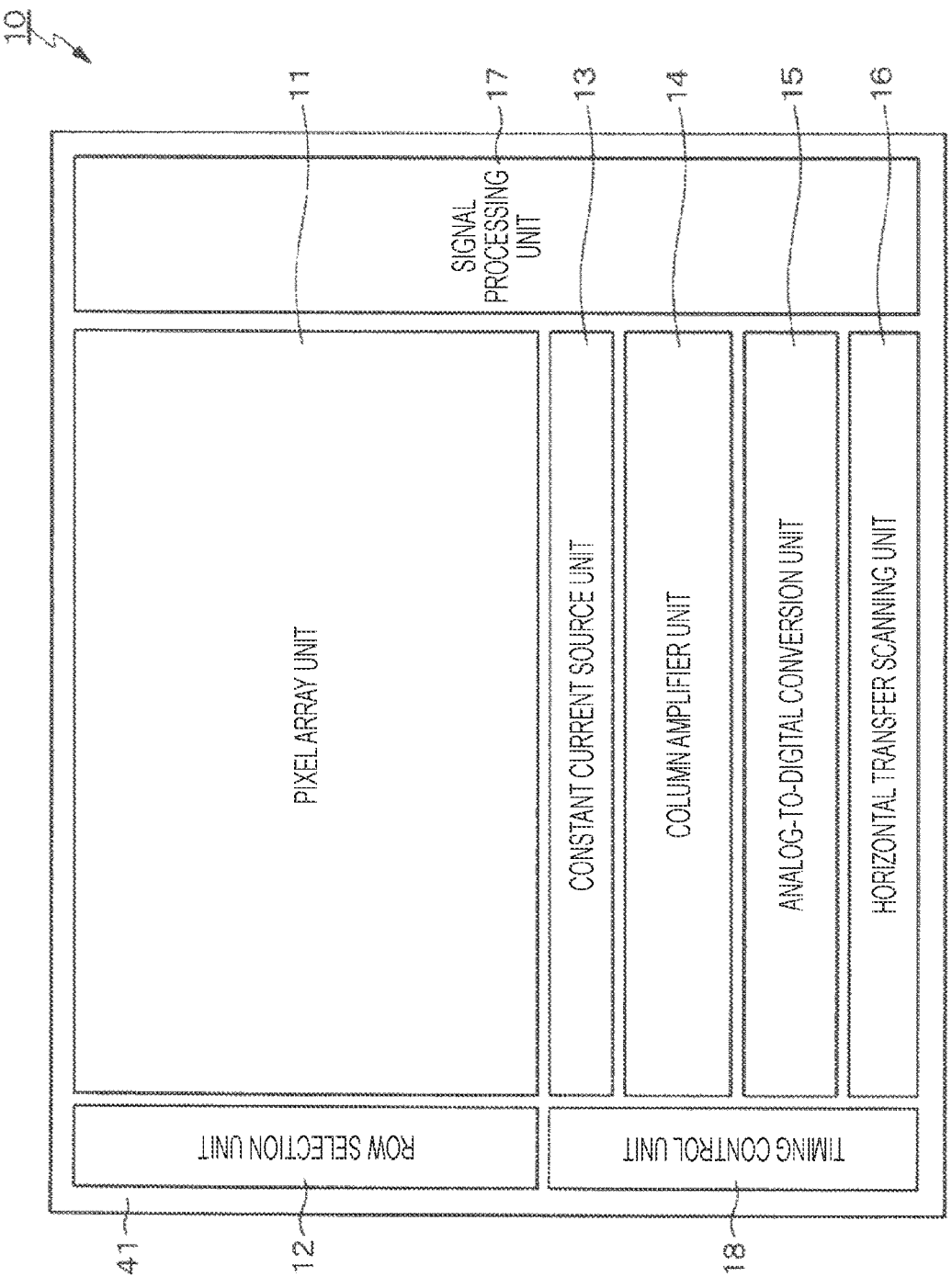
FIG. 3 is a plan view schematically depicting an outline of a flat semiconductor chip structure of the CMOS image sensor.

FIG. 3 is a plan view schematically depicting an outline of the flat semiconductor chip structure of the CMOS image sensor 10. As illustrated in FIG. 3, the flat semiconductor chip structure has a structure in which a circuit portion around the pixel array unit 11 is formed on the same semiconductor chip (semiconductor substrate) 41 as the pixel array unit 11 in which the pixels 20 are arranged in a matrix. Specifically, the row selection unit 12, the constant current source unit 13, the column amplifier unit 14, the analog-to-digital conversion unit 15, the horizontal transfer scanning unit 16, the signal processing unit 17, the timing control unit 18, and the like are formed on the same semiconductor chip 41 as the pixel array unit 11.

(Stacked Semiconductor Chip Structure)

Figure 4:
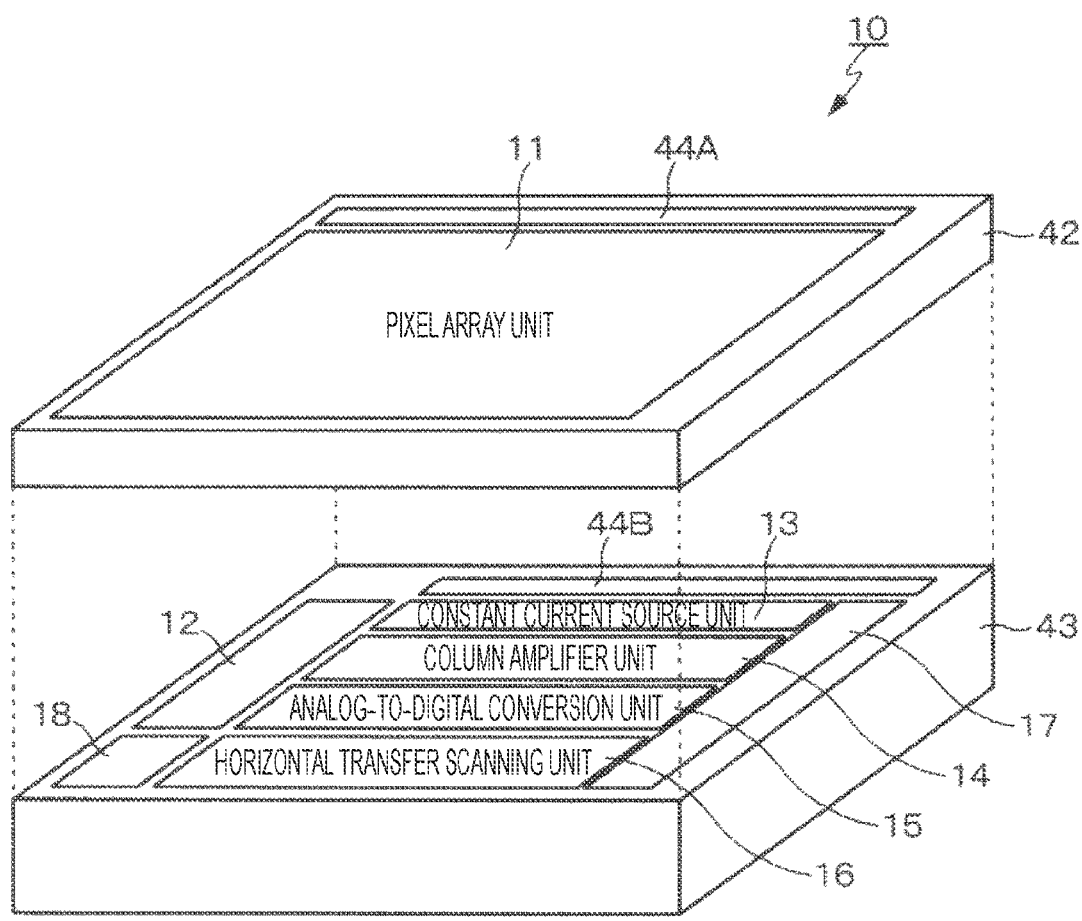
FIG. 4 is an exploded perspective view schematically depicting an outline of a stacked semiconductor chip structure of the CMOS image sensor.

FIG. 4 is an exploded perspective view schematically depicting an outline of a stacked chip structure of the CMOS image sensor 10. As illustrated in FIG. 4, the stacked semiconductor chip structure is a structure in which at least two semiconductor chips (semiconductor substrates) of a first-layer semiconductor chip 42 and a second-layer semiconductor chip 43 are stacked. In this stacked structure, the pixel array unit 11 is formed on the first-layer semiconductor chip 42. Furthermore, circuit portions such as the row selection unit 12, the constant current source unit 13, the column amplifier unit 14, the analog-to-digital conversion unit 15, the horizontal transfer scanning unit 16, the signal processing unit 17, the timing control unit 18 and the like are formed on the second-layer semiconductor chip 43. Then, the first-layer semiconductor chip 42 and the second-layer semiconductor chip 43 are electrically connected through connection portions (VIA) 44A and 44B such as Cu—Cu connection and the like.

In the CMOS image sensor 10 having this stacked structure, the first-layer semiconductor chip 42 only needs to have a size (area) enough to form the pixel array unit 11, and thus the size (area) of the first-layer semiconductor chip 42 and a size of the entire chip can be reduced. Moreover, since a process suitable for manufacturing the pixel 20 can be applied to the first-layer semiconductor chip 42 and a process suitable for manufacturing the circuit portion can be applied to the second-layer semiconductor chip 43, there is also an advantage that the process can be optimized in manufacturing the CMOS image sensor 10. In particular, an advanced process can be applied to manufacture the circuit portion.

Note that, here, the stacked structure of a two-layer structure formed by stacking the first-layer semiconductor chip 42 and the second-layer semiconductor chip 43 has been exemplified, but the stacked structure is not limited to the two-layer structure, and may be a structure of three or more layers. Then, in a stacked structure of three or more layers, circuit portions such as the row selection unit 12, the constant current source unit 13, the column amplifier unit 14, the analog-to-digital conversion unit 15, the horizontal transfer scanning unit 16, the signal processing unit 17, the timing control unit 18 and the like can be formed in a distributed manner on the semiconductor chips of the second and subsequent layers.

[Single-Slope Analog-to-Digital Converter]

In the CMOS image sensor 10 having the configuration described above, for example, a single-slope analog-to-digital converter has been generally used as the analog-to-digital converter in the analog-to-digital conversion unit 15. Here, the single-slope analog-to-digital converter will be described.

In the single-slope analog-to-digital converter, a signal of an inclined waveform (ramp wave) that linearly changes with a certain inclination is used as a base signal. The single-slope analog-to-digital converter compares an analog pixel signal read from the pixel 20 with a base signal of a ramp wave, amplifies and clips a difference between the pixel signal and a base signal to modulate the signal into a phase signal, and then performs sampling to convert the signal into a digital signal. This single-slope analog-to-digital converter has the following problems.

Problem 1

An offset occurs due to a delay during modulation to a phase signal. Therefore, digital correlated double sampling (CDS) for removing fixed pattern noise of the pixel 20 is essential, and additional time for two analog-to-digital conversions and auto-zero is required.

Problem 2

When the pixel signal crosses the base signal of the ramp wave, a through current or kickback occurs. Furthermore, time for the crossing depends on a level of the pixel signal, and causes interference with the analog-to-digital converter of other pixel columns.

Problem 3

Since the amplification transistor 24 of the pixel 20 is used to hold the voltage during analog-to-digital conversion, conversion time limits reading speed of the pixel signal.

Regarding Problem 1, in the single-slope analog-to-digital converter, auto-zero (offset cancellation due to input and output short) of input amplifier is performed to prevent offset. Thus, DC offset can be removed. However, since the base signal of the ramp wave changes with time, AC offset due to a delay cannot be removed. The delay can be reduced by widening a band, but output phase noise increases.

Problem 2 is known as a mechanism of an interference phenomenon (streaking) from a bright portion to a dark portion. In the single-slope analog-to-digital converter, when a plurality of pixel columns has the same brightness, switching occurs all at once, and thus an influence of interference increases.

Problem 3 is a problem caused by not sampling the potential of the signal line 32. In the amplification transistor 24 of the pixel 20, relatively large power is consumed to drive the signal line 32 having a large load capacitance. It is therefore not advisable to use the amplification transistor 24 only to hold a voltage during analog-to-digital conversion.

First Embodiment of Present Disclosure

In an imaging apparatus (CMOS image sensor as an example) according to a first embodiment of the present disclosure, a successive approximation register (SAR) analog-to-digital converter is used as each analog-to-digital converter of the analog-to-digital conversion unit 15. The successive approximation register analog-to-digital converter can operate at higher speed and with lower power consumption as compared with the single-slope analog-to-digital converter having the various problems described above. In the present embodiment, a column signal processing system including the successive approximation register analog-to-digital converter can be operated at higher speed and with lower power consumption.

Figure 5:
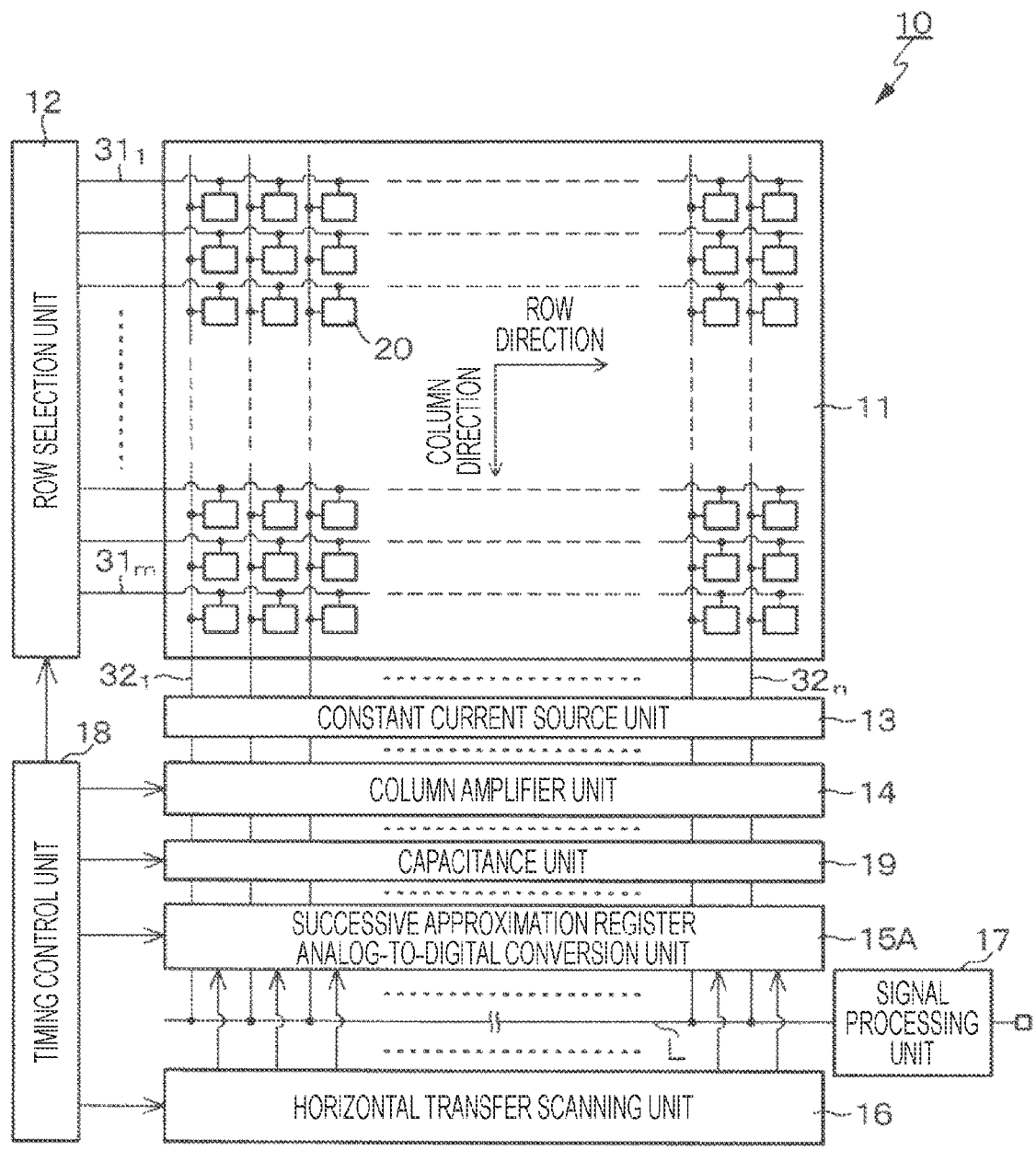
FIG. 5 is a block diagram depicting an outline of a configuration of a CMOS image sensor as an example of an imaging apparatus according to a first embodiment of the present disclosure.

FIG. 5 is a block diagram depicting an outline of a configuration of a CMOS image sensor as an example of an imaging apparatus according to a first embodiment of the present disclosure.

In the CMOS image sensor 10 according to the present embodiment, the column amplifier unit 14 performs processing (CDS processing) of obtaining a difference between a signal component (so-called D-phase) input from each pixel 20 of the pixel array unit 11 through the signal line 32 and a reset component (so-called P-phase), and outputs the difference as a pixel signal. A capacitance unit 19 is provided at a subsequent stage of the column amplifier unit 14.

The capacitance unit 19 holds the pixel signal input from the column amplifier unit 14 by, for example, sampling with a switched capacitor. A successive approximation register analog-to-digital conversion unit 15A is provided at a subsequent stage of the capacitance unit 19. The successive approximation register analog-to-digital conversion unit 15A includes a plurality of successive approximation register (SAR) analog-to-digital converters capable of operating at higher speed and with low power consumption as compared with the single-slope analog-to-digital converter, and converts an analog pixel signal input from the capacitance unit 19 into a digital pixel signal.

In the CMOS image sensor 10 according to the present embodiment, each successive approximation register analog-to-digital converter of the successive approximation register analog-to-digital conversion unit 15A performs binary search, and thus is more efficient in principle than a single-slope analog-to-digital converter that performs a sweep when viewed alone. In addition, the number of times of analog-to-digital conversion can be halved by performing the CDS processing that has been conventionally performed by two analog-to-digital conversions in the analog-to-digital converter by the column amplifier unit 14 of an analog circuit system. Furthermore, by introducing sampling with a switched capacitor, a potential VSL of the signal line does not need to wait for analog-to-digital conversion, and sampling is always performed all at once regardless of the potential VSL of the signal line 32. Therefore, the influence of interference due to switching is also small.

Hereinafter, description will be made of a specific example of a column signal processing system in the CMOS image sensor 10 according to the first embodiment, specifically, a column signal processing system including the column amplifier unit 14, the capacitance unit 19, and the analog-to-digital conversion unit 15.

First Embodiment

Figure 6:
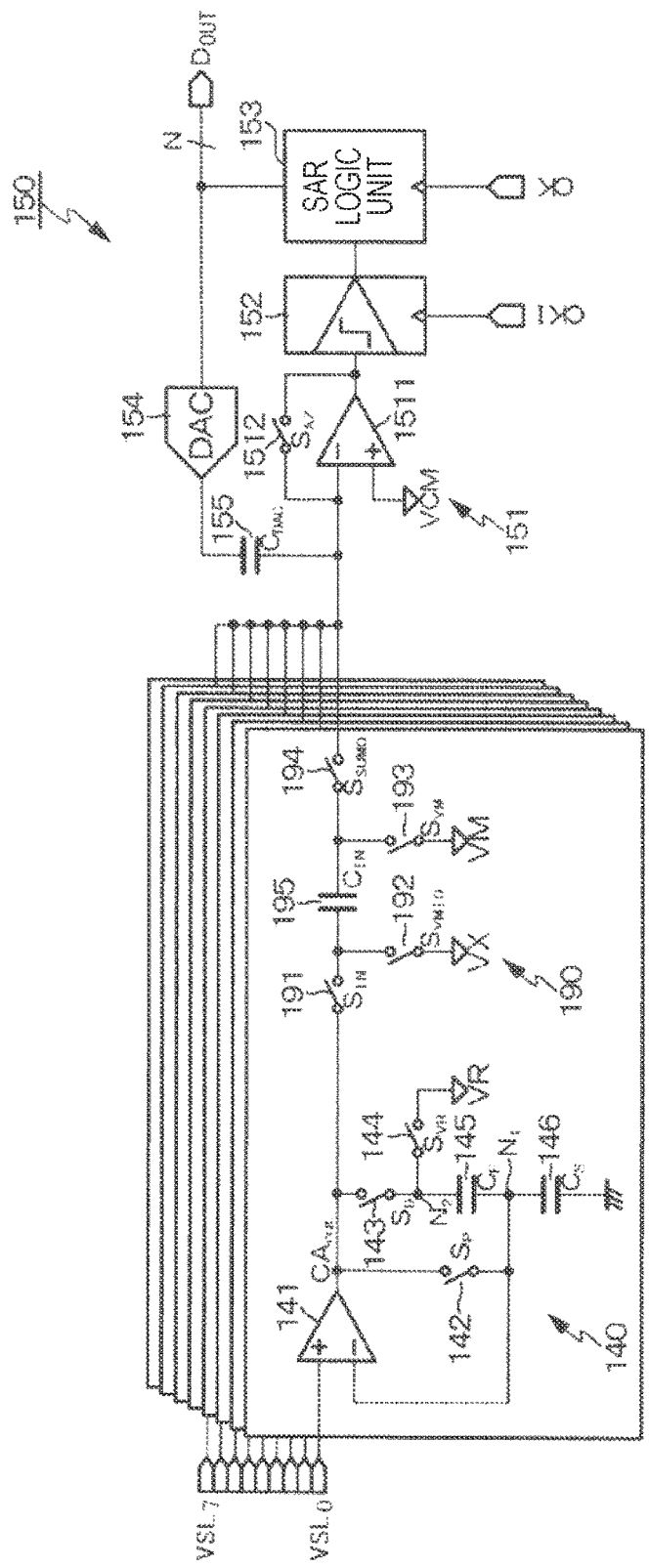
FIG. 6 is a circuit diagram depicting an outline of a configuration of a column signal processing system according to the first embodiment.

The first embodiment is an example of an intermittent operation in which the successive approximation register analog-to-digital converter performs conversion processing only during the P-phase in which the reset component is input and stands by during the D-phase in which the signal component is input. FIG. 6 is a circuit diagram depicting an outline of a configuration of a column signal processing system according to the first embodiment. The column amplifier unit 14 includes column amplifiers 140 as many as the number of pixel columns provided as the number of pixel columns, and the capacitance unit 19 also includes the capacitance multiplexers 190 as many as the number of pixel columns.

Here, a configuration will be described as an example in which, for one successive approximation register analog-to-digital converter 150 of the successive approximation register analog-to-digital conversion unit 15A, potentials $VSL_0$ to $VSL_7$ of the plurality of signal lines 32, for example, eight signal lines 32 are each multiplexed and processed through eight column amplifiers 140 and capacitance multiplexers 190 corresponding to the eight signal lines 32.

(Configuration Example of Column Amplifier)

The column amplifier 140 includes an amplifier 141, a first switch 142, a second switch 143, a third switch 144, a first capacitive element 145, and a second capacitive element 146. The first capacitive element 145 (hereinafter simply described as the "capacitive element 145") has a capacitance value $C_F$, and the second capacitive element 146 (hereinafter simply described as the "capacitive element 146") has a capacitance value $C_S$.

The amplifier 141 uses the potential VSL ($VSL_0$ to $VSL_7$) of the signal line 32 as an input of a non-inverting (+) input terminal. The first switch 142 (hereinafter simply described as the "switch 142") has one end connected to an output terminal of the amplifier 141 and another end connected to an inverting (−) input terminal of the amplifier 141, and performs an on (closed)/off (open) operation in accordance with a polarity (high level/low level) of a switch control signal $S_P$.

The second switch 143 (hereinafter simply described as the "switch 143") has one end connected to the output terminal of the amplifier 141. The capacitive element 145 has one end connected to another end of the switch 143 and another end connected to the other end of the switch 142 and the inverting input terminal of the amplifier 141. The capacitive element 146 is connected between the other end of the capacitive element 145 and the output terminal of the amplifier 141 and a node of a base potential (for example, ground). The switch 143 performs an on/off operation in accordance with a polarity of a switch control signal $S_D$.

That is, the switch 143, the capacitive element 145, and the capacitive element 146 are connected in series between the output terminal of the amplifier 141 and a node of a base potential (for example, ground) in that order. In addition, a common connection node $N_1$ between the capacitive element 145 and the capacitive element 146 and the other end of the switch 142 are electrically connected to each other.

The third switch 144 (hereinafter simply described as the "switch 144") has one end connected to a common connection node $N_2$ between the switch 143 and the capacitive element 145, and performs an on/off operation in accordance with a polarity of a switch control signal $S_{VR}$. A local base voltage VR defining zero voltage of an output of the column amplifier 140 is applied to another end of the switch 144. That is, the switch 144 selectively applies the local base voltage VR to the common connection node $N_2$ between the switch 143 and the capacitive element 145.

(Configuration Example of Capacitance Multiplexer)

The capacitance multiplexer 190 constituting the capacitance unit 19 includes four switches 191 to 194 and one capacitive element 195, and is configured to perform sampling with a switched capacitor. The capacitive element 195 has a capacitance value $C_{IN}$.

The switch 191 has one end connected to an output end of the column amplifier 140, that is, the output terminal of the amplifier 141, and performs an on/off operation in accordance with a polarity of a switch control signal $S_{IN}$. The switch 192 has one end connected to another end of the switch 191, and performs an on/off operation in accordance with a polarity of a switch control signal $S_{VMI0}$. A specific reference voltage VX is applied to another end of the switch 192. The local base voltage VR may be used as the specific reference voltage VX.

The capacitive element 195 has one end connected to the other end of the switch 191. The switch 193 has one end connected to another end of the capacitive element 195, and performs an on/off operation in accordance with a polarity of a switch control signal $S_{VM}$. An intermediate voltage VM used when resetting a capacitor array unit ($C_{DAC}$) 155 of the successive approximation register analog-to-digital converter 150 is applied to another end of the switch 193.

The switch 194 has one end connected to the other end of the capacitive element 195 and the one end of the switch 193, and performs an on/off operation in accordance with a polarity of a switch control signal $S_{SUM0}$. The switch 194 has another end commonly connected among the eight capacitance multiplexers 190 corresponding to the potentials $VSL_0$ to $VSL_7$ of the signal line 32, and serves as an output end of the capacitance multiplexer 190.

(Configuration Example of Successive Approximation Register Analog-to-Digital Converter)

The successive approximation register analog-to-digital converter 150 includes a preamplifier 151, a comparator 152, a SAR logic unit 153, a digital-to-analog converter (DAC) 154, and the capacitor array unit ($C_{DAC}$) 155.

The preamplifier 151 includes an amplifier 1511 and a switch 1512. The amplifier 1511 uses the analog voltage supplied from the capacitance multiplexer 190 as an input of an inverting (−) input terminal, and uses an output common mode reference voltage $V_{CM}$ as an input of a non-inverting (+) input terminal. The switch 1512 is an auto-zero (offset cancellation by input and output short) switch, is connected between an inverting (−) input terminal and an output terminal of the preamplifier 151, and performs an on/off operation in accordance with a polarity of a switch control signal $S_{AZ}$.

The comparator 152 compares a magnitude of the analog voltage supplied through the preamplifier 151 with a magnitude of a comparison base voltage in synchronization with a comparator clock CKI, and supplies a result of the comparison to the SAR logic unit 153.

The SAR logic unit 153 includes, for example, an N-bit successive approximation register, stores a comparison result of the comparator 152 for each bit in synchronization with the clock CK, and outputs the comparison result as an N-bit digital value $D_{OUT}$ after analog-to-digital conversion.

The digital-to-analog converter 154 and the capacitor array unit 155 constitute an N-bit capacitive digital-to-analog converter. Then, in this capacitive digital-to-analog converter, the N-bit digital value $D_{OUT}$ output from the SAR logic unit 153 is converted into an analog voltage and is applied as an input to an inverting (−) input terminal of the amplifier 1511.

(Circuit Operation of Column Signal Processing System)

Next, a circuit operation of the column signal processing system according to the first embodiment including the column amplifier 140, the capacitance multiplexer 190, and the successive approximation register analog-to-digital converter 150 having a configuration described above will be described with reference to a timing chart in FIG. 7.

Figure 7:
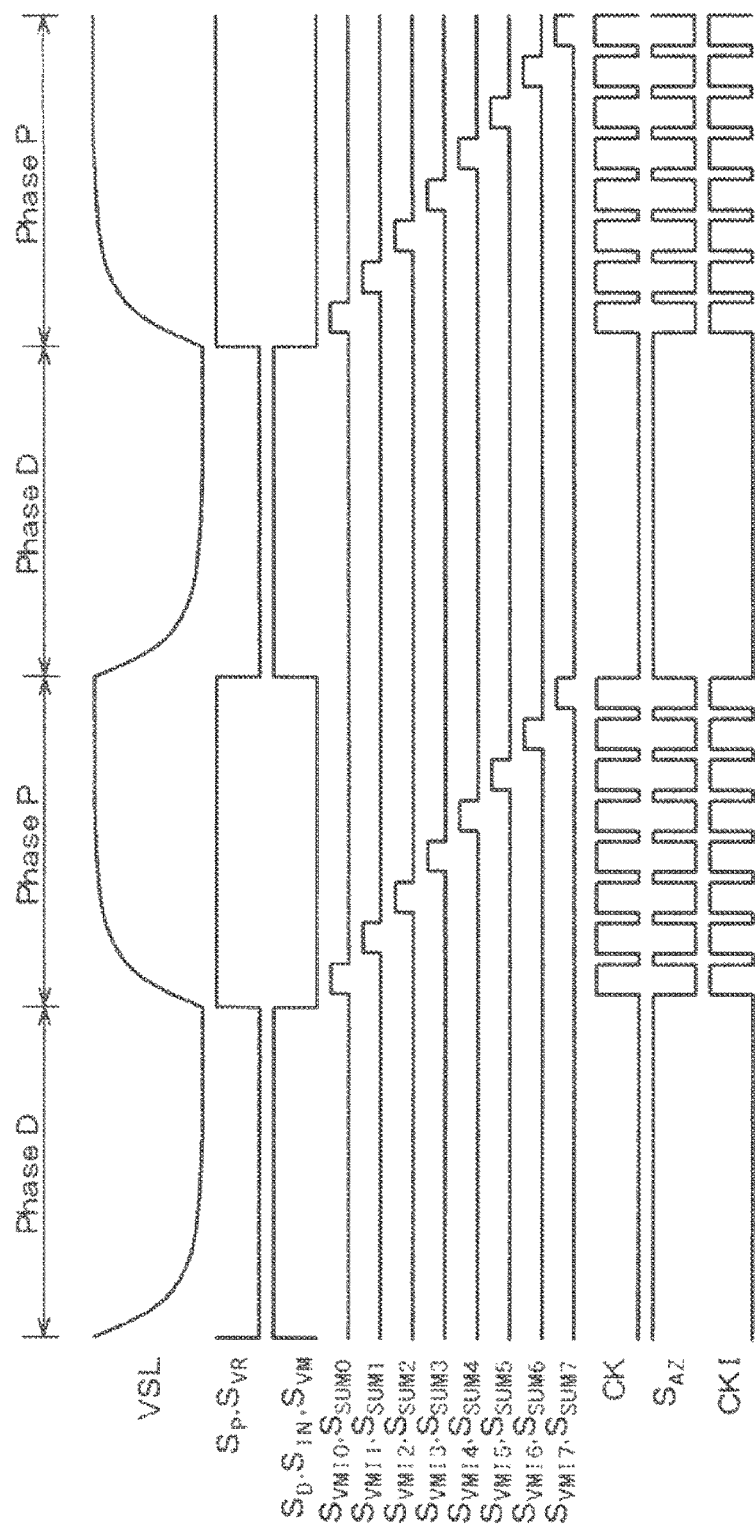
FIG. 7 is a timing chart for describing circuit operation of the column signal processing system according to the first embodiment.

The timing chart in FIG. 7 illustrates a timing relationship among the potential VSL of the signal line 32, the switch control signals $S_P$ and $S_{VR}$, the switch control signals $S_D$, $S_{IN}$, and $S_{VM}$, the switch control signals $S_{VMI0}$ and $S_{SUM0}$ to $S_{VMI7}$ and $S_{SUM7}$, the clock CK, the switch control signal $S_{AZ}$, and the comparator clock CKI.

First, the potentials $VSL_0$ to $VSL_7$ of the eight signal lines 32 are each input to the corresponding dedicated column amplifiers 140. When the switch control signal Se and the switch control signal $S_{VR}$ are at a high level while each of the potentials $VSL_0$ to $VSL_7$ of the eight signal lines 32 is in a state of a reset component (P-phase voltage), the switch 142 and the switch 144 enter an on (closed) state. Thus, the reset component (P-phase voltage) is charged by the capacitive element 145 and the capacitive element 146. At this time, in the voltage at the common connection node $N_2$ between the switch 143 and the capacitive element 145, the reset component (P-phase voltage) greatly varies (has low accuracy) depending on the pixel 20, but the local base voltage VR, which is generated on a side of the column amplifier 140, less varies (has high accuracy).

Next, when the switch control signal Se and the switch control signal $S_{VR}$ is at a low level, the switch 142 and the switch 144 enter an off (open) state, and at the same time, when the switch control signal $S_D$ is at a high level, the switch 143 enters an on (closed) state. At this time, the capacitive element 145, the capacitive element 146, and the amplifier 141 configure a non-inverting amplifier circuit, and the output voltage $V_{out}$ of the column amplifier 140 is substantially the same voltage as the local base voltage VR.

Thereafter, when each of the potentials $VSL_0$ to $VSL_7$ of the eight signal lines 32 changes (specifically, descends) to a signal component (D-phase voltage) as a luminance component, feedback is applied so that a voltage at the common connection node $N_1$ between the capacitive element 145 and the capacitive element 146 becomes the same voltage as the signal component (D-phase voltage). By this series of operations, CDS processing of obtaining a difference between the reset component (P-phase voltage) and the signal component (D-phase voltage) is performed, and the output voltage $V_{out}$ of the column amplifier 140 drops by a voltage amplified to $(C_F+C_S)/C_F$ times the potential VSL of the signal line 32.

The signal component amplified by the column amplifier 140 is input to the capacitance multiplexer 190 including the same number of capacitive elements 195 as the column amplifier 140. In the capacitance multiplexer 190, during the D-phase, the switch control signal $S_{IN}$ and the switch control signal $S_{VM}$ are at a high level. In response to this, the switch 191 and the switch 193 enter an on state, and thus the intermediate voltage VM is applied to the capacitive element 195. Then, the switch control signal $S_{IN}$ and the switch control signal $S_{VM}$ are at a low level, and in response to this, the switch 191 and the switch 193 enter an off state. Thus, charges are held in the capacitive element 195 having the capacitance value $C_{IN}$.

Next, during the P-phase, the switch control signal $S_{VMIx}$ (x=0 to 7) and the switch control signal $S_{SUMx}$ (x=0 to 7) sequentially become a high level, and the switch 192 and the switch 194 are set to an on state. Thus, the charge held in the capacitive element 191 is transferred to the successive approximation register analog-to-digital converter 150. The charge is transferred by dividing time of the P-phase into eight. Since the D-phase is used for sampling, the charge can be transferred only in the P-phase.

When the capacitive element 191 is connected to an input end of the successive approximation register analog-to-digital converter 150 through the switch 194, the comparator clock CKI is input to the comparator 152 to start the comparison. The comparison result of the comparator 152 is fed back to the digital-to-analog converter 154 via the SAR logic unit 153, and is binary-searched so that an input of the preamplifier 151 becomes 0 V. Finally, almost all the charges accumulated in the capacitive element 195 of the capacitance multiplexer 190 are transferred to the capacitor array unit ($C_{DAC}$) 155, and an input of the digital-to-analog converter 154 at that time is obtained as an output code.

Note that it is necessary to set the switch 1512 of the preamplifier 151 to an on (closed) state by setting the switch control signal $S_{AZ}$ to a high level and reset the charge of the capacitor array unit ($C_{DAC}$) 155 before the next connection of the capacitive element 195.

As described above, in the circuit operation of the column signal processing system according to the first embodiment, the successive approximation register analog-to-digital converter 150 performs the intermittent operation of operating only during the P-phase and standing by without doing anything during the D-phase. In a standby state, the circuit current is stopped so as not to consume power, but a portion that fails to respond at a high-speed cannot be stopped to cause waste. Furthermore, since a power supply current greatly changes between the P-phase and the D-phase, it takes time to stabilize a power supply voltage immediately after recovery.

In addition, in the configuration of the column signal processing system according to the first embodiment, in the capacitance multiplexer 190, the capacitive element 195 needs to sample the output of the column amplifier 140 in the D-phase, and thus cannot keep holding the charge.

Second Embodiment

Figure 8:
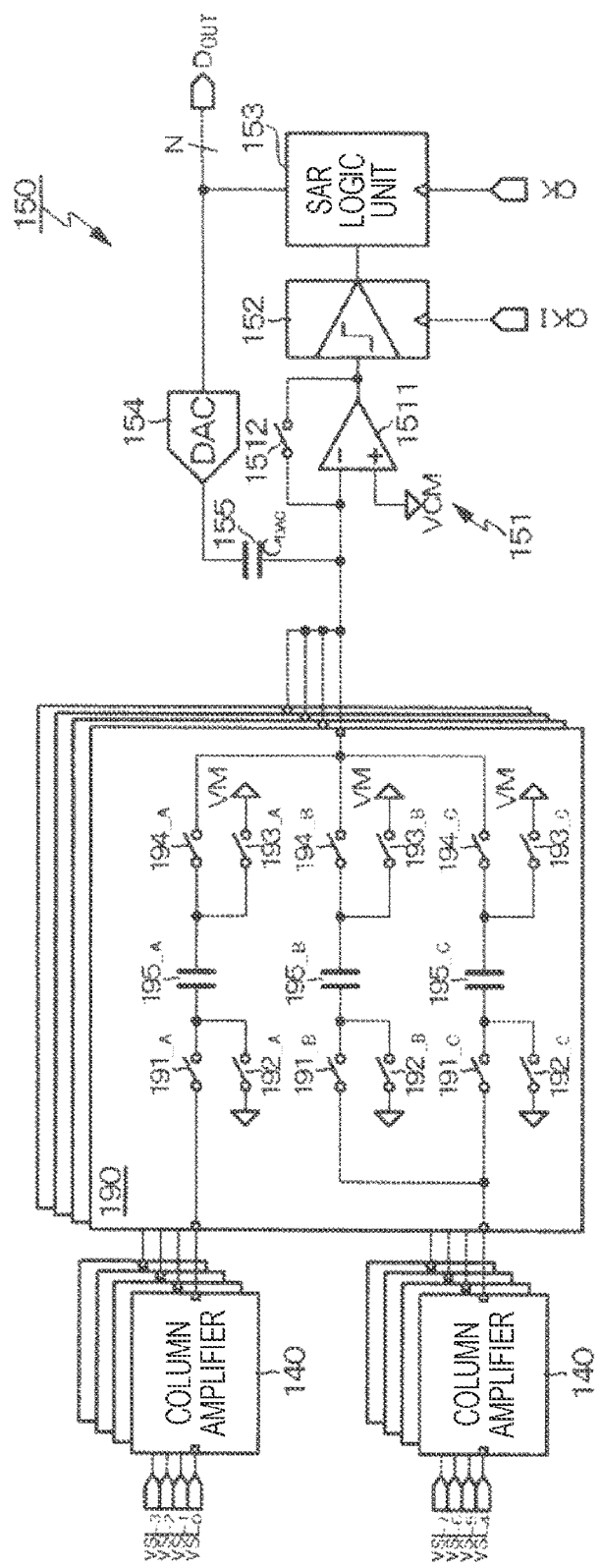
FIG. 8 is a circuit diagram depicting an outline of a configuration of a column signal processing system according to a second embodiment.

A second embodiment is a modification of the first embodiment, and is an example of a non-intermittent operation in which the successive approximation register analog-to-digital converter performs the conversion processing not only during the P-phase in which the reset component is input but also during the D-phase in which the signal component is input. FIG. 8 is a circuit diagram depicting an outline of a configuration of a column signal processing system according to a second embodiment.

Assuming that a P-phase period and a D-phase period are approximately the same and the analog-to-digital conversion is performed in half in each phase, in a case where the potentials $VSL_0$ to $VSL_7$ of the eight signal lines 32 are each multiplexed and processed, the analog-to-digital conversion is performed four times.

In the column signal processing system according to the second embodiment, as illustrated in FIG. 8, the potentials $VSL_0$ to $VSL_7$ of the eight signal lines 32 are each divided into the potentials $VSL_0$ to $VSL_3$ of the four signal lines 32 in the first half and the potentials $VSL_4$ to $VSL_7$ of the four signal lines 32 in the second half and handled.

The analog-to-digital conversion for the potentials $VSL_0$ to $VSL_3$ of the first four signal lines 32 is performed during the P-phase, and thus have the same configuration as that in the intermittent operation in the column signal processing system according to the first embodiment. Since the sampling and the analog-to-digital conversion are simultaneously performed for the potentials $VSL_4$ to $VSL_7$ of the four signal lines 32 in the latter half during the D-phase, double capacitive elements are prepared, and the capacitive elements are alternately used for each sampling.

Specifically, three systems of circuits that perform sampling by a switched capacitor are provided. A first system is a circuit including a switch $191_{-A}$, a switch $192_{-A}$, a switch $193_{-A}$, a switch $194_{-A}$, and a capacitive element $195_{-A}$. The switch $191_{-A}$, the switch $192_{-A}$, and the switch $193_{-A}$ perform an on/off operation in accordance with polarities of switch control signals $S_{IN0A}$, $S_{VMIA0}$, $S_{VWA}$, and $S_{SUMA0}$.

A second system is a circuit including a switch $191_{-B}$, a switch $192_{-B}$, a switch $193_{-B}$, a switch $194_{-B}$, and a capacitive element $195_{-B}$. The switch $191_{-B}$, the switch $192_{-B}$, and the switch $193_{-B}$ perform an on/off operation in accordance with polarities of switch control signals $S_{IN1B}$, $S_{VMIB0}$, $S_{VMB}$, and $S_{SUMB0}$.

A third system is a circuit including a switch $191_{-C}$, a switch $192_{-C}$, a switch $193_{-C}$, a switch $194_{-C}$, and a capacitive element $195_{-C}$. The switch $191_{-C}$, the switch $192_{-C}$, and the switch $193_{-C}$, and the switch $194_{-C}$ perform an on/off operation in accordance with polarities of switch control signals $S_{IN1C}$, $S_{VMIC}$, $S_{VMC}$, and $S_{SUMC0}$.

In the capacitance multiplexer 190 of the column signal processing system according to the second embodiment having a configuration described above, during the P-phase, the circuit including the switch $191_{-A}$, the switch $192_{-A}$, the switch $193_{-A}$, the switch $194_{-A}$, and the capacitive element $195_{-A}$ operates for the potentials $VSL_0$ to $VSL_3$ of the four signal lines 32 in the first half. During the D-phase, the circuit including the switch $191_{-B}$, the switch $192_{-B}$, the switch $193_{-B}$, the switch $194_{-B}$, and the capacitive element $195_{-B}$ and the circuit including the switch $191_{-C}$, the switch $192_{-C}$, the switch $193_{-C}$, the switch $194_{-C}$, and the capacitive element $195_{-C}$ operate for the potentials $VSL_4$ to $VSL_7$ of the four signal lines 32 in the latter half.

Third Embodiment

Figure 9:
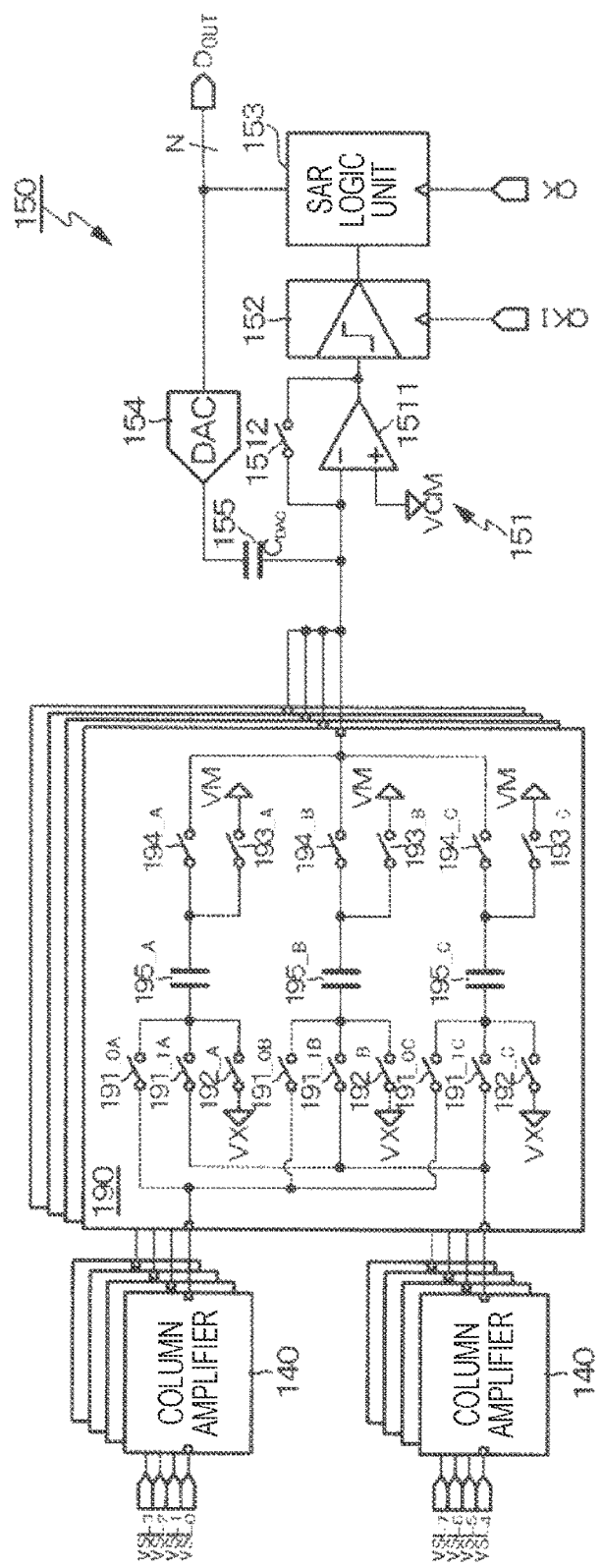
FIG. 9 is a circuit diagram depicting an outline of a configuration of a column signal processing system according to a third embodiment.

A third embodiment is a modification of the second embodiment, and is an example in which three capacitive elements ($195_{-A}$, $195_{-B}$, and $195_{-C}$) of the capacitance unit 19 (capacitance multiplexer 190) are evenly used for the potentials $VSL_0$ to $VSL_3$ of the signal lines 32 and the potentials $VSL_4$ to $VSL_7$ of the two systems of signal lines 32. FIG. 9 is a circuit diagram depicting an outline of a configuration of a column signal processing system according to a third embodiment.

(Configuration Example of Column Signal Processing System)

In the capacitance multiplexer 190 of the column signal processing system according to the third embodiment, two systems of the switch $191_{-A}$, the switch $191_{-B}$, and the switch $191_{-C}$ are provided. Then, each of a switch $191_{0A}$, a switch $191_{0B}$, and a switch $191_{0C}$ of one system has one end commonly connected to the output end of the column amplifier 140 of the potentials $VSL_0$ to $VSL_3$ of the four signal lines 32 in the first half, and performs an on/off operation in accordance with polarities of switch control signals $S_{IN0A}$, $S_{IN0B}$, and $S_{IN0C}$.

Furthermore, each of a switch $191_{1A}$, a switch $191_{1B}$, and a switch $191_{1C}$ of the other system has one end commonly connected to the output end of the column amplifier 140 of the potentials $VSL_4$ to $VSL_7$ of the four signal lines 32 in the latter half, and performs an on/off operation in accordance with polarities of switch control signals $S_{IN1A}$, $S_{IN1B}$, and $S_{IN1C}$.

Each of the switch $191_{0A}$ and the switch $191_{1A}$ has another end commonly connected to an input end of the capacitive element $195_{-A}$ together with another end of the switch $192_{-A}$. Each of the switch $191_{0B}$ and the switch $191_{1B}$ has another end commonly connected to an input end of the capacitive element $195_{-B}$ together with another end of the switch $192_{-B}$. Each of the switch $191_{0C}$ and the switch $191_{1C}$ has another end commonly connected to an input end of the capacitive element $195_{-C}$ together with another end of the switch $192_{-C}$.

(Circuit Operation of Column Signal Processing System)

Figure 10:
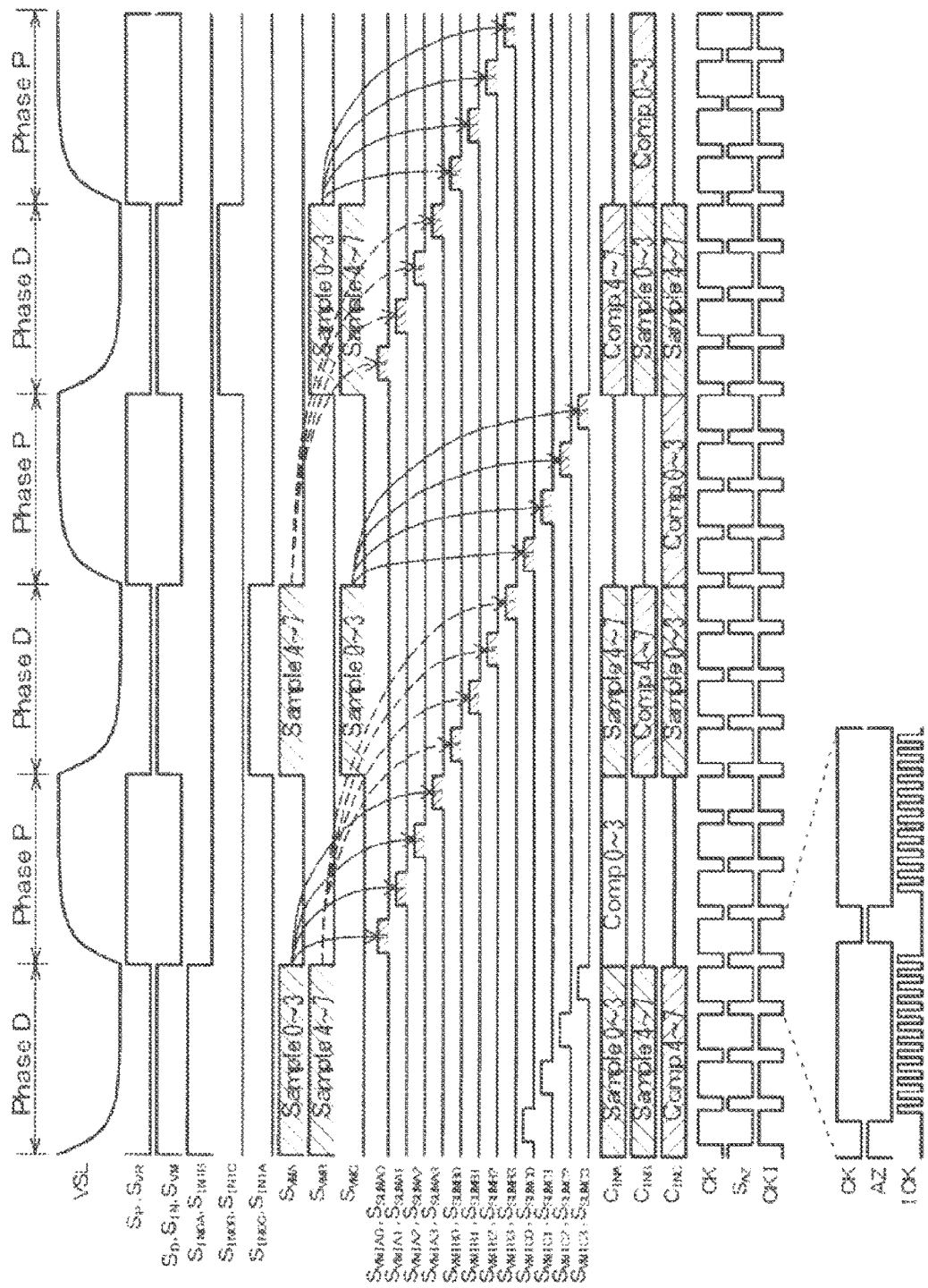
FIG. 10 is a timing chart for describing circuit operation of the column signal processing system according to the third embodiment.

FIG. 10 is a timing chart for describing circuit operation of the column signal processing system according to the third embodiment.

The timing chart in FIG. 10 illustrates a timing relationship among the potential VSL of the signal line 32, the switch control signals $S_P$ and $S_{VR}$, the switch control signals $S_D$, $S_{IN}$, and $S_{VM}$, the switch control signals $S_{IN0A}$ and $S_{IN1B}$, the switch control signals $S_{IN0B}$ and $S_{IN1C}$, the switch control signals $S_{IN0C}$ and $S_{IN1A}$, and the switch control signals $S_{VMA}$, $S_{VWB}$, and $S_{VMC}$. The timing chart of FIG. 10 further illustrates a timing relationship among the switch control signals $S_{VMIA0}$, $S_{SUMA0}$ to $S_{VMIA3}$, and $S_{SUMA3}$, the switch control signals $S_{VMIB0}$, $S_{SUMB0}$ to $S_{VMIB3}$, and $S_{SUMB3}$, the switch control signals $S_{VMIC0}$, $S_{SUMC0}$ to $S_{VIMC3}$, and $S_{SUMC3}$, the clock CK, the switch control signal $S_{AZ}$, and the comparator clock CKI.

The column amplifier 140 outputs a signal in the D-phase. Therefore, sampling in the three capacitive elements ($195_{-A}$, $195_{-B}$, and $195_{-C}$) is performed only in the D-phase, while comparison in the comparator 152 is continuously performed in both the P-phase and the D-phase. In an example of the timing chart in FIG. 10, in the first D-phase, the potentials $VSL_0$ to $VSL_3$ of the signal line 32 are sampled by the capacitive element $195_{-A}$, and the potentials $VSL_4$ to $VSL_7$ of the signal line 32 are sampled by the capacitive element $195_{-B}$.

The potentials $VSL_0$ to $VSL_3$ of the signal line 32 are analog-to-digital converted in the immediately subsequent P-phase, and the potentials $VSL_4$ to $VSL_7$ of the signal line 32 are analog-to-digital converted in the second D-phase. In the second D-phase, since the capacitive element $195_{-B}$ is used for analog-to-digital conversion, the output of the column amplifier 140 at that time is sampled by the capacitive element $195_{-C}$ and capacitive element $195_{-A}$ which are available. At this time, the potentials $VSL_4$ to $VSL_7$ of the signal line 32 different from the previous time are sampled in the capacitive element $195_{-A}$. Repeating this operation prevents use of the same capacitive element every time for the potential VSL of the specific signal line 32.

In the successive approximation register analog-to-digital converter 150, before every performance of analog-to-digital conversion, the switch 1512 of the preamplifier 151 is set to an on (closed) state to perform auto zero for determining an initial value of the capacitor array unit ($C_{DAC}$) 155. At this time, the switch 194 of the capacitance multiplexer 190 is in an off (open) state.

During the auto zero, the capacitor array unit ($C_{DAC}$) 155 is set to an arbitrary reset code, and the reset code at this time is an output code when an input voltage is 0 V.

The auto-zero has an effect of canceling the offset of the preamplifier 151, but it should be noted that in this analog-to-digital conversion, the offset cannot be completely canceled since the input capacitance is separated at the time of sampling.

After a lapse of a certain period of time, the switch 1512 of the preamplifier 151 is set to an off (open) state, and the switch 192 and the switch 194 of the capacitance multiplexer 190 are set to an on (closed) state to transfer charges. At the same time, the intermediate voltage VM is applied to all of the capacitor array unit 155 (see FIG. 11).

After settling, the first pulse of the clock ICK is input to start comparison operation. The clock ICK is input a plurality of times, an analog-to-digital conversion result is determined, and the processing proceeds to the next analog-to-digital conversion. The auto-zero takes more time than settling of the capacitor array unit 155, and thus has a predetermined length. In addition, time from the auto-zero to the first clock ICK is set to a predetermined period.

In the configuration of the column signal processing system according to the second embodiment illustrated in FIG. 8, the capacitive element $195_{\_A}$ is always used for sampling the potentials $VSL_0$ to $VSL_3$ of the signal line 32, but the capacitive element $195_{\_B}$ and the capacitive element $195_{\_C}$ are alternately used for sampling the potentials $VSL_4$ to $VSL_7$ of the signal line 32, which may cause a systematic error.

On the other hand, in the configuration of the column signal processing system according to the third embodiment, as is apparent from the circuit operation described above, the three capacitive elements ($195_{\_A}$, $195_{\_B}$, and $195_{\_C}$) are evenly used for the potentials $VSL_0$ to $VSL_3$ of the two systems of signal lines 32 and the potentials $VSL_4$ to $VSL_7$ of the signal lines 32. It is therefore possible to avoid occurrence of a systematic error.

Fourth Embodiment

Figure 11:
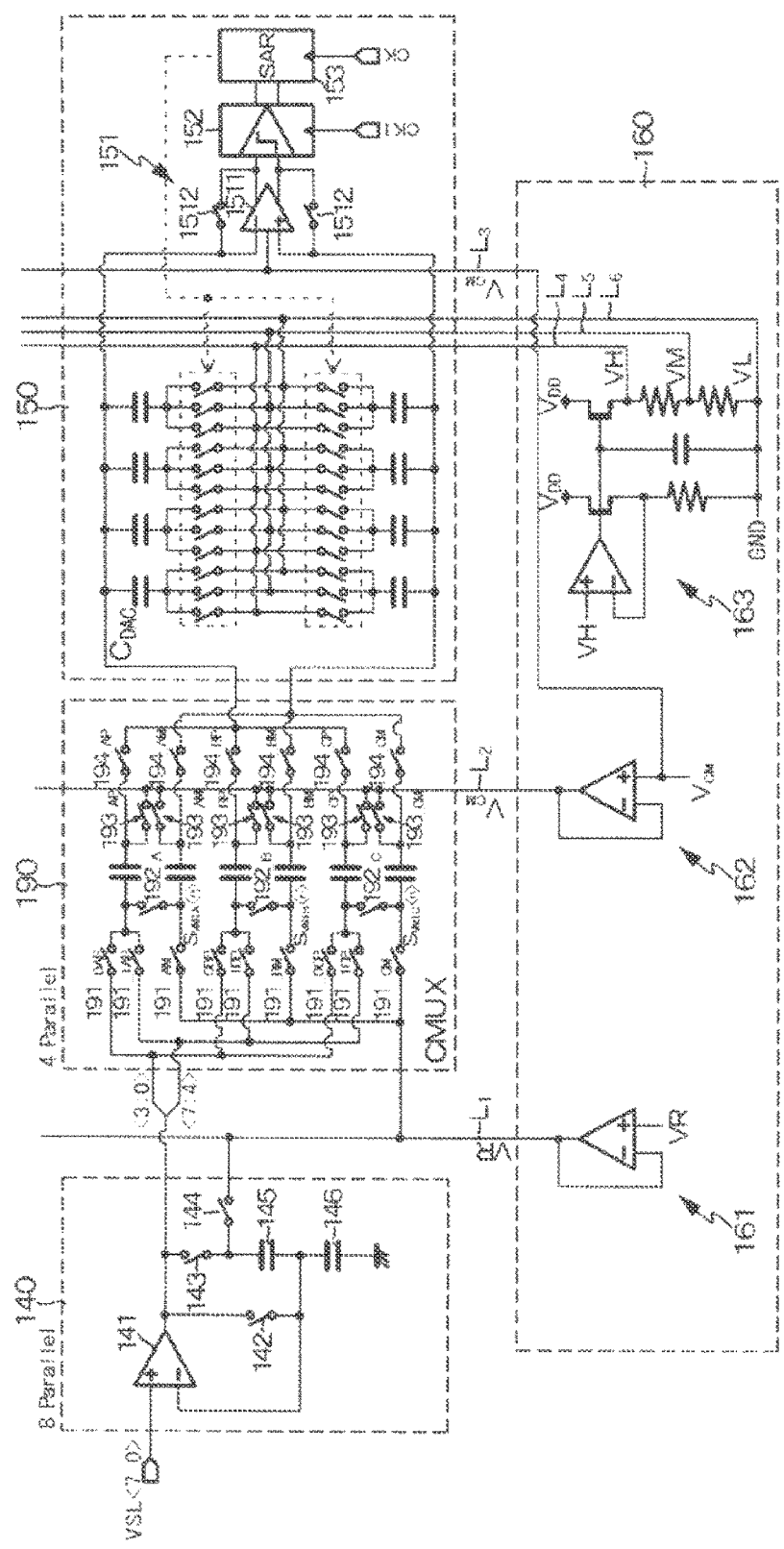
FIG. 11 is a circuit diagram depicting an outline of a configuration of a column signal processing system according to a fourth embodiment.

A fourth embodiment is an implementation example of the column signal processing system, and is an example in which the capacitance unit 19 (capacitance multiplexer 190) and the subsequent portions have a configuration of a differential circuit. FIG. 11 is a circuit diagram depicting an outline of a configuration of a column signal processing system according to a fourth embodiment.

FIG. 11 illustrates a base voltage generation unit 160 that generates a base voltage used in the column amplifier 140, the capacitance multiplexer 190, and the successive approximation register analog-to-digital converter 150. The base voltage generation unit 160 includes a first amplifier unit 161, a second amplifier unit 162, and a third amplifier unit 163.

The first amplifier unit 161 generates the local base voltage VR that defines the zero voltage of the output of the column amplifier 140. The local base voltage VR is supplied to the column amplifier 140 through a voltage line $L_1$. The second amplifier unit 162 supplies the output common mode reference voltage $V_{CM}$ of the preamplifier 151 to the capacitance multiplexer 190 through a voltage line $L_2$. The output common mode reference voltage $V_{CM}$ is also supplied to the successive approximation register analog-to-digital converter 150 through a voltage line $L_3$. The third amplifier unit 163 generates a high voltage VH, a medium voltage VM, and a low voltage VL to be used in the capacitor array unit ($C_{DAC}$) 155. The high voltage VH, the medium voltage VM, and the low voltage VL are supplied to the capacitor array unit ($C_{DAC}$) 155 through voltage lines $L_4$, $L_5$, and $L_6$.

During the P-phase, the capacitive element 145 of the column amplifier 140 is charged by the local base voltage VR, and in the D-phase, the local base voltage VR is set as a signal input on a negative side of the capacitance multiplexer (CMUX) 190. The capacitance multiplexer 190 is configured differentially. The switches $192_{\_A}$, $192_{\_B}$, and $192_{\_C}$ on an input side are short-circuited between differentials at the time of comparison of the comparator 152, and are not connected to a common node. In this way, since an input side of the capacitance multiplexer 190 is completely separated at the time of comparison of the comparator 152, settling of the capacitor array unit ($C_{DAC}$) 155 in the successive approximation register analog-to-digital converter 150 can be accelerated.

Switches $193_{\_AP}$ and $193_{\_AM}$, switches $193_{\_BP}$ and $193_{\_BM}$, and switches $193_{\_CP}$ and $193_{\_CM}$ on an output side of the capacitance multiplexer 190 are connected to the voltage line $L_2$ that transmits the output common mode reference voltage $V_{CM}$, and are in an on state at the time of sampling. The output common mode reference voltage $V_{CM}$ is the same voltage as an input operating potential of the preamplifier 151.

The high voltage VH, the medium voltage VM, and the low voltage VL generated by the third amplifier unit 163 are base voltages of the capacitor array unit ($C_{DAC}$) 155. Since the capacitor array unit ($C_{DAC}$) 155 operates at a high speed at the time of comparison of the comparator 152, the high voltage VH and the low voltage VL are required to be able to respond at a high speed and to have a low impedance.

(Power Supply Voltage and Transistor to be Used)

Here, for a specification of the power supply voltage, for example, 2.8 V ($V_{DD}\_H$) and 0.8 V ($V_{DD}\_L$) are assumed. 2.8 V is the same as the voltage used in the pixel 20, and is used for a circuit of a high breakdown voltage transistor. 0.8 V is assumed to be a voltage used in a logic circuit. The potential VSL of the signal line 32 is 2 V or more at maximum, and cannot be handled by a low breakdown voltage transistor. Therefore, the column amplifier 140 needs to be configured by a high breakdown voltage transistor. The successive approximation register analog-to-digital converter 150 requires a high-speed comparison operation, and is desirable to be configured by a low breakdown voltage transistor. However, it is necessary to pay attention to a large leakage current of the low breakdown voltage transistor.

In addition, when a plurality of power supplies is involved between loops of the successive approximation register analog-to-digital converter 150, an operation margin for absorbing variations between different power supplies is required, and it is therefore important to configure with a single power supply. The high voltage VH and the low voltage VL are set to 0.8 V ($V_{DD}\_L$) and the same voltage as the ground, respectively, in order to sufficiently apply a gate voltage to the switches constituting the capacitor array unit ($C_{DAC}$) 155. Since the output of the column amplifier 140 has a high voltage, all the switches constituting the capacitance multiplexer 190 are configured by high breakdown voltage transistors.

(Level Diagram)

Figure 12:
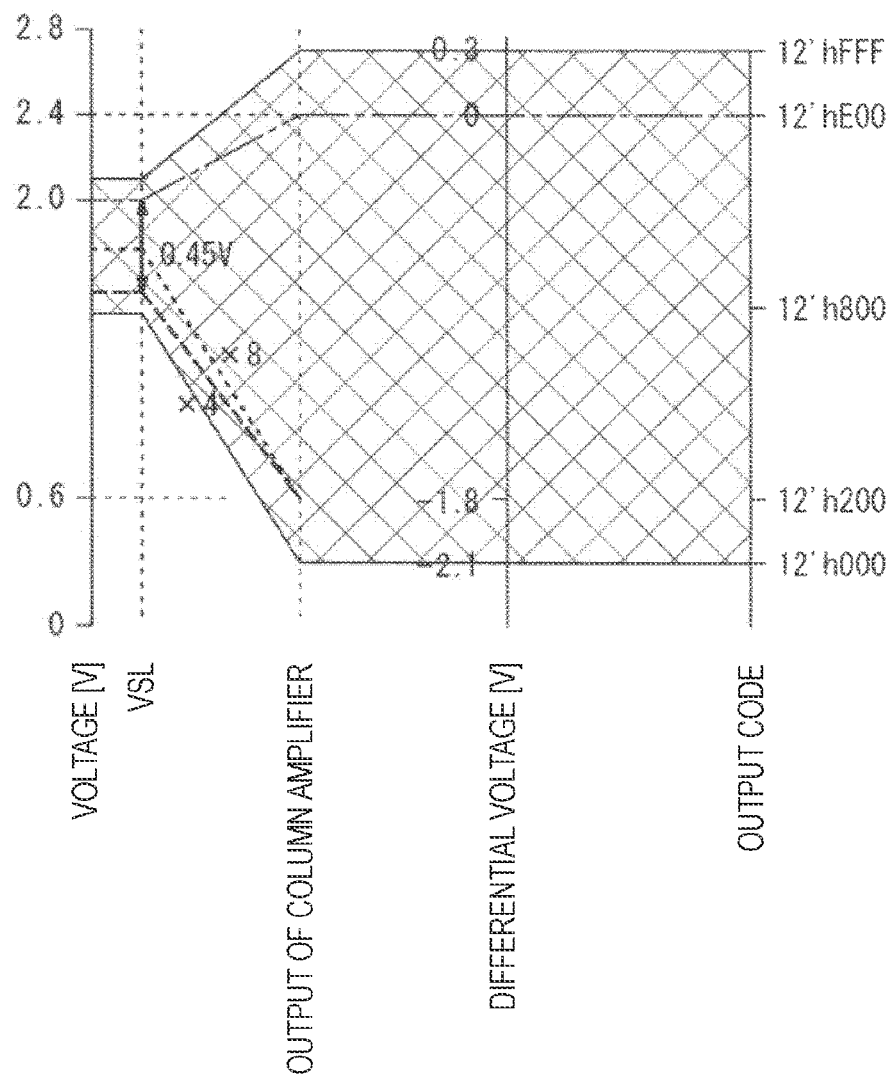
FIG. 12 is a diagram for describing a level diagram.

FIG. 12 illustrates a level diagram. A voltage range of the potential VSL of the signal line 32 varies depending on a sensor specification, but here, it is assumed that the voltage decreases in accordance with brightness with 2 V as a reference and the voltage drops by 450 mV at maximum. The potential VSL of the signal line 32 is amplified by the column amplifier 140. As a gain is higher, noise of the successive approximation register analog-to-digital converter 150 in the subsequent stage is suppressed, and noise of the column amplifier 140 is also reduced. It is therefore desirable to take a gain as large as possible. However, since the power supply voltage is 2.8 V, it is necessary to suppress the output of the column amplifier 140 within a range obtained by adding an operation range and a margin of the circuit to the power supply voltage.

Here, the gain is set to four times, and the range is 1.8 V with respect to 2.8 V. The input of the successive approximation register analog-to-digital converter 150 is a differential voltage, and an input on a negative side is fixed at a reference voltage. When the pixel 20 has a brightness of 0, a differential of 0 V is an input to the successive approximation register analog-to-digital converter 150, and a negative differential voltage is applied as the pixel becomes brighter (that is, the potential VSL of the signal line 32 decreases). A relationship with the output code of the successive approximation register analog-to-digital converter 150 is such that the differential 1.8 V corresponds to ¾ full scale, and ⅞ full scale is output when 0 V is input.

For a small input signal, an input conversion noise can be reduced by increasing the gain. As illustrated in FIG. 12, when the gain is eight times (×8), an input range is halved. Furthermore, although the gain could be increased, since a contribution of the column amplifier 140 is dominant in the input conversion noise, setting the gain larger than eight times would not be of great benefit.

Hereinafter, specific configuration examples of the column amplifier 140 and the successive approximation register analog-to-digital converter 150 will be described.

(Configuration Example of Column Amplifier)

Figure 13:
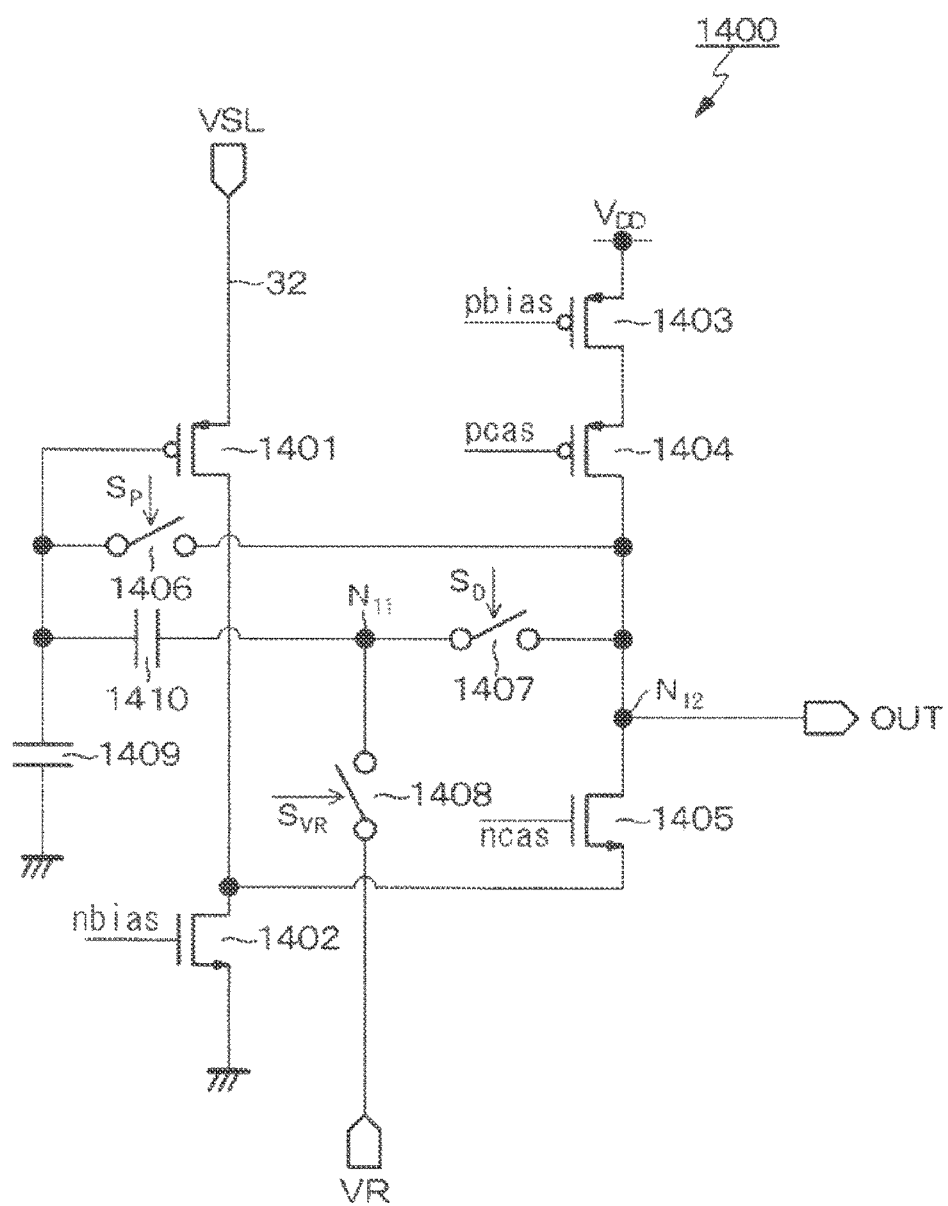
FIG. 13 is a circuit diagram depicting an example of a configuration of a current reuse column amplifier.

Here, as an example of a specific configuration of the column amplifier 140, a current reuse column amplifier (CRCA) will be exemplified. Since the current reuse column amplifier performs voltage amplification by using the bias current of the signal line 32, a non-inverting column amplifier having lower power consumption can be achieved. FIG. 13 is a circuit diagram depicting an example of the configuration of the current reuse column amplifier.

A current reuse column amplifier 1400 includes a current amplification transistor 1401, current source transistors 1402 and 1403, cascode transistors 1404 and 1405, switches 1406, 1407, and 1408, a base side capacitive element 1409, and a feedback capacitive element 1410.

Here, for example, a P-channel MOS field effect transistor is used as the current amplification transistor 1401, the current source transistor 1403, and the cascode transistor 1404. Furthermore, for example, an N-channel MOS field effect transistor is used as the current source transistor 1402 and the cascode transistor 1405.

The current amplification transistor 1401 and the current source transistor 1402 are connected in series between the signal line 32 and a node of a base potential (for example, ground) in that order. That is, a source electrode of the current amplification transistor 1401 is connected to the signal line 32. A predetermined bias voltage nbias is applied to a gate electrode of the current source transistor 1402. As a result, the current source transistor 1402 causes a constant bias current corresponding to the predetermined bias voltage nbias to flow through the signal line 32.

The current source transistor 1403, the cascode transistor 1404, and the cascode transistor 1405 are connected in series between a node of the power supply voltage $V_{DD}$ and a drain electrode of the current source transistor 1402 in that order. A predetermined bias voltage pbias is applied to a gate electrode of the current source transistor 1403, a predetermined bias voltage pcas is applied to a gate electrode of the cascode transistor 1404, and a predetermined bias voltage ncas is applied to a gate electrode of the cascode transistor 1405.

The switch 1406 is connected between a gate electrode of the current amplification transistor 1401 and a drain electrode of the cascode transistor 1404 (a drain electrode of the cascode transistor 1405), and performs an on (closed)/off (open) operation in accordance with the polarity of the switch control signal $S_P$.

The base side capacitive element 1409 is connected between the gate electrode of the current amplification transistor 1401 and a node of a base potential (for example, ground). The feedback capacitive element 1410 has one end connected to the gate electrode of the current amplification transistor 1401.

A switch 1047 is connected between another end of the feedback capacitive element 1410 and the drain electrode of the cascode transistor 1404 (the drain electrode of the cascode transistor 1405), and performs an on/off operation in accordance with the polarity of the switch control signal $S_D$.

The switch 1408 has one end connected to a common connection node $N_{11}$ between the feedback capacitive element 1410 and the switch 1047, and performs an on/off operation in accordance with the polarity of the switch control signal $S_{VR}$. The local base voltage VR is applied to another end of the switch 1408. As a result, the switch 1408 selectively applies the local base voltage VR to the common connection node $N_{11}$ under the control of the switch control signal $S_{VR}$.

In the configuration described above, the current reuse column amplifier 1400 is configured in which the source electrode of the current amplification transistor 1401 serves as a (+) input end, the gate electrode serves as a (−) input end, and a common connection node $N_{12}$ between the cascode transistor 1404 and the cascode transistor 1405 serves as an output end. The current amplification transistor 1401, which uses the bias current of the signal line 32, enables voltage amplification to be efficiently performed.

In the current reuse column amplifier 1400 having a configuration described above, in a correspondence relationship with the column amplifier 140 illustrated in FIG. 6, the switch 1406 corresponds to the switch 142 in FIG. 6, the switch 1407 corresponds to the switch 143 in FIG. 6, and the switch 1408 corresponds to the switch 144 in FIG. 6. In addition, the base side capacitive element 1409 corresponds to the capacitive element 146 having the capacitance value $C_S$, and the feedback capacitive element 1410 corresponds to the capacitive element 145 having the capacitance value $C_F$.

(Configuration Example of Successive Approximation Register Analog-to-Digital Converter)

Figure 14:
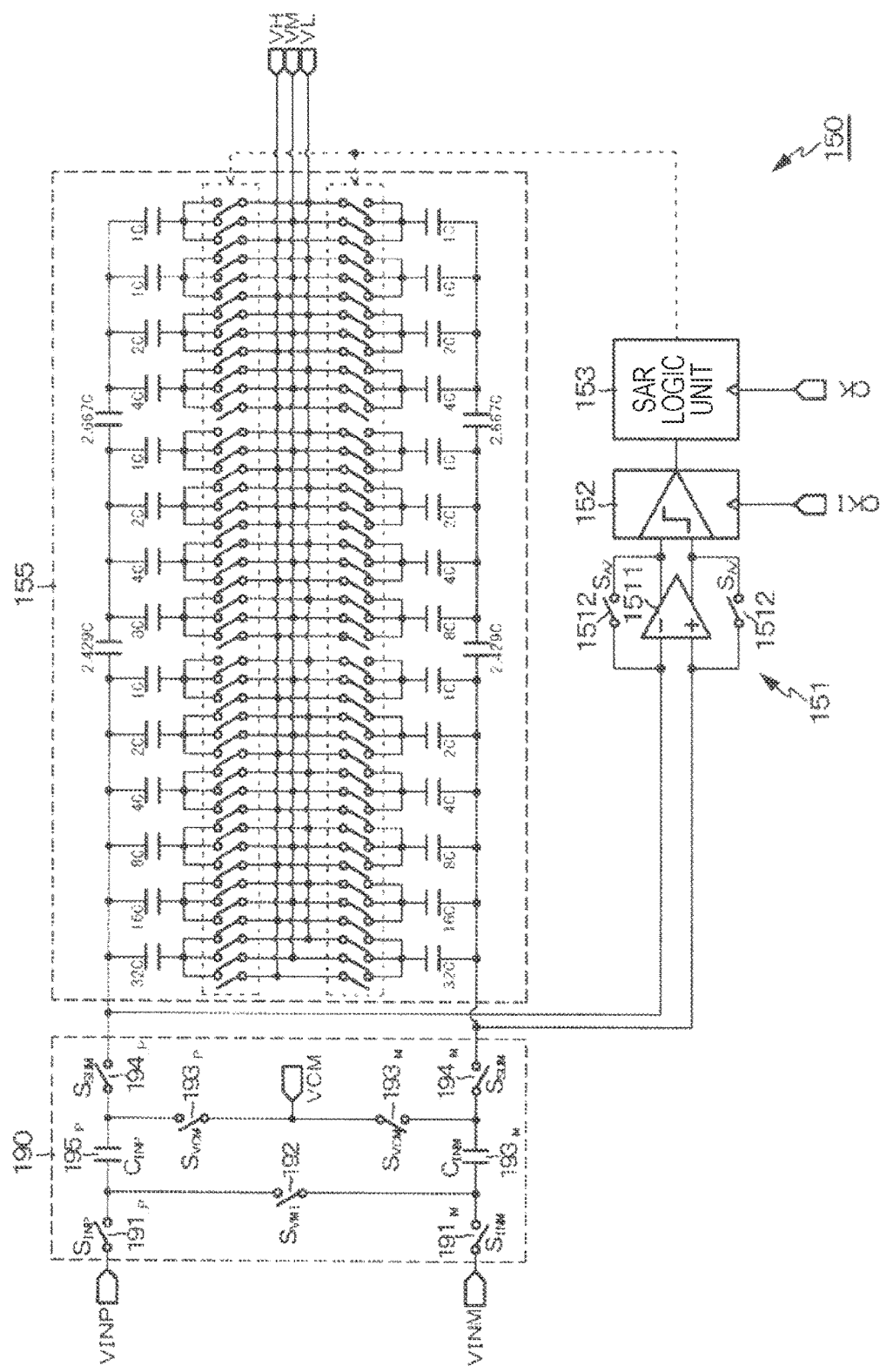
FIG. 14 is a detailed circuit diagram of a successive approximation register analog-to-digital converter.

The successive approximation register analog-to-digital converter 150 is excellent in power efficiency. FIG. 14 is a detailed circuit diagram of the successive approximation register analog-to-digital converter 150.

A circuit of the successive approximation register analog-to-digital converter 150 is configured by a complete differential. In a general successive approximation register analog-to-digital converter, an input capacitance for sampling an input voltage and a DAC capacitance ($C_{DAC}$) are often integrated, but here, the input capacitance and the DAC capacitance ($C_{DAC}$) are separated for multiplexing.

FIG. 14 also illustrates an input capacitance unit that also serves as the capacitance multiplexer 190 (hereinafter, for convenience, described as "capacitance multiplexer 190"). Here, for the sake of simplicity, only one of the plurality of input capacitance units (190) is illustrated.

In the capacitance multiplexer 190, at the time of sampling, switches $191_{\_P}$ and $191_{\_M}$ and switches $193_{\_P}$ and $193_{\_M}$ are in an on (closed) state to charge capacitive elements $195_{\_P}$ and $195_{\_M}$ with electric charges. At the time of analog-to-digital conversion, the switch 192 and switches $194_{\_P}$ and $194_{\_M}$ are in an on (closed) state, and thus the capacitance multiplexer 190 is connected to the successive approximation register analog-to-digital converter 150.

The switch 192 is not connected to a specific reference potential, but only short-circuits between differentials. This is to prevent an in-phase potential on a side of the preamplifier 151 from varying due to an in-phase potential of an input. If an output in-phase potential of the preamplifier 151 and the output common mode reference voltage $V_{CM}$ are matched, an input in-phase potential of the preamplifier 151 is always the same as the output common mode reference voltage $V_{CM}$.

Since the output of the column amplifier 140 is single-ended, the in-phase potential of the input varies depending on the signal, but linearity is improved because the input in-phase potential of the preamplifier 151 does not change. The input side has the output (2.4 V to 0.6 V) of the column amplifier 140 and the local base voltage VR (2.4 V), but since the output common mode reference voltage $V_{CM}$ is fixed at about 0.5 V, the preamplifier 151 having the low voltage ($V_{DD\_L}$) can be used.

Although an input differential voltage is as high as 1.8 V, because of connection in series with the DAC capacitance ($C_{DAC}$) at the time of charge transfer, the input voltage of the preamplifier 151 is sufficiently attenuated. In this way, by managing the in-phase and differential voltages, devices other than the capacitance multiplexer 190 can be constituted by a thin film low-voltage transistor having a relatively thin film thickness. Incidentally, all the switches of the capacitance multiplexer 190 are configured by a high-voltage transistor having a relatively large film thickness.

All the switches of the preamplifier 151, the comparator 152, the SAR logic unit 153, and the DAC capacitance ($C_{DAC}$) in a comparison loop of the successive approximation register analog-to-digital converter 150 use transistors of the same power supply voltage and the same film thickness, and thus enable high-speed operation.

It is also important that the SAR logic unit 153 is completely separated from the column amplifier 140 and reference nodes other than the high voltage VH and the low voltage VL during operation. Since these nodes are not so fast and low impedance, it is necessary not to affect settling of the DAC capacitance ($C_{DAC}$).

As illustrated in FIG. 14, a capacitance array of the DAC capacitance ($C_{DAC}$) includes 14 capacitances grouped by 6-4-4. The first 6-bit group is defined as MSB, the middle 4-bit group is defined as LSB1, and the last 4-bit group is defined as LSB0. Each group is separated by a bridge capacitive element, and a weight per capacitive element changes. When the weight of the MSB is 1, LSB1 is ⅛ and LSB0 is 1/32.

The weights of the most significant bit in LSB1 and the least significant bit of the MSB have the same value with redundancy. Similarly, in LSB0, the most significant bits overlap. Since the redundancy is 2 bits in total, a bit accuracy of the successive approximation register analog-to-digital converter 150 is finally 12 BIT. The redundancy is for compensating for insufficient settling of upper bits and for correcting nonlinearity due to variations in the bridge capacitive elements.

In order to widen a range of redundancy, redundant bits should be inserted as high as possible, but there will be a trade-off of increasing capacitive elements, and there will be also an increase in noise. Furthermore, in order to correct variations in the bridge capacitive elements, redundant bits need to be inserted into each group.

The capacitance value $C_B$ of the bridge capacitive element can be expressed by the following equation, where a ratio of a weight to a lower group is $\alpha$ ($<1$), and a total capacitance value of the lower group (further including a lower substantial capacitance value) is $C_{TL}$.

$$C_B = C_{TL}/\{(1/\alpha)-1\}$$

Since the bridge capacitive element determines a weight of entire lower bits, a deviation in a ratio of the bridge capacitive element and a unit capacitive element causes nonlinearity. Thus, it is necessary to perform implementation without deviation as much as possible, but it is difficult to match the ratio of the bridge capacitive element and the unit capacitive element because the ratio is not an integral multiple and there is no continuity in layout. It is therefore considered necessary to perform digital correction to multiply a non-integer correction coefficient for each group.

Second Embodiment of Present Disclosure

A second embodiment of the present disclosure is an example in which the technology according to the present disclosure is applied to an indirect time-of-flight (TOF) distance image sensor. The indirect TOF distance image sensor is a sensor that measures a distance to a measurement object by measuring a light flight time on the basis of detection of an arrival phase difference of a reflected light emitted from a light source and reflected by the measurement object (subject).

[Example of System Configuration]

Figure 15:
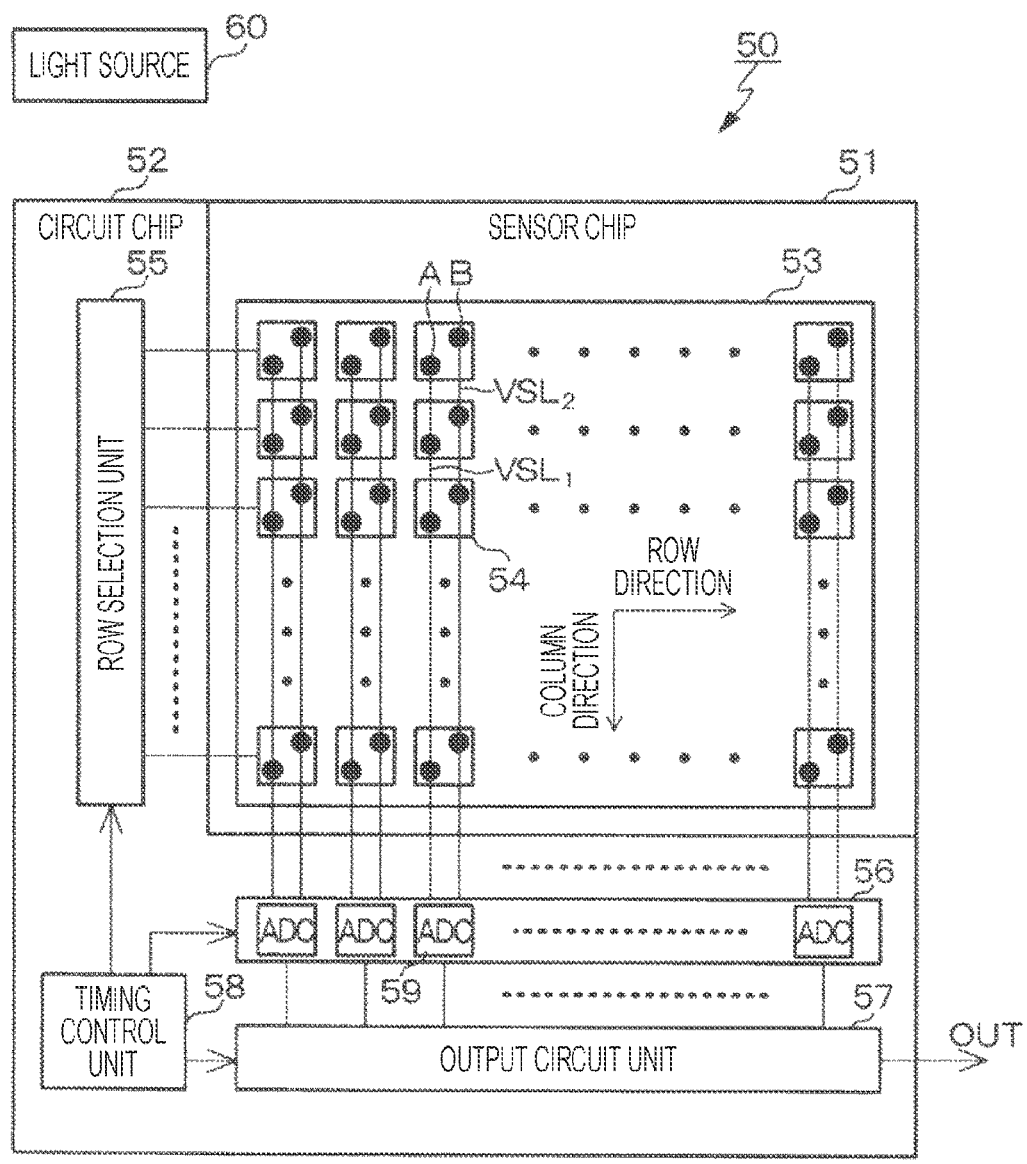
FIG. 15 is a block diagram depicting an example of a system configuration of an indirect TOF distance image sensor according to the second embodiment of the present disclosure.

FIG. 15 is a block diagram depicting an example of a system configuration of an indirect TOF distance image sensor according to the second embodiment of the present disclosure.

In an indirect TOF distance image sensor 50, light emitted from a light source 60 is reflected by a measurement object (subject), and the reflected light is incident. The indirect TOF distance image sensor 50 has a stacked structure including a sensor chip 51 and a circuit chip 52 stacked on the sensor chip 51. In this stacked structure, the sensor chip 51 and the circuit chip 52 are electrically connected through a connection portion (not illustrated) such as a via (VIA), a Cu—Cu connection, and the like. Note that FIG. 15 illustrates a state in which a wire of the sensor chip 51 and a wire of the circuit chip 52 are electrically connected via the connection portion described above.

A pixel array unit 53 is formed on the sensor chip 51. The pixel array unit 53 includes a plurality of pixels 54 arranged in a matrix (array) in a two-dimensional grid pattern on the sensor chip 51. In the pixel array unit 53, each of the plurality of pixels 54 receives incident light (for example, near infrared light), performs photoelectric conversion, and outputs an analog pixel signal. In the pixel array unit 53, two signal lines $VSL_1$ and $VSL_2$ are wired for each pixel column. When the number of pixel columns of the pixel array unit 53 is M (M is an integer), a total of ($2 \times M$) signal lines VSL are wired in the pixel array unit 53.

Each of the plurality of pixels 54 has first and second taps A and B (details of which will be described later). An analog pixel signal $AIN_{P1}$ based on charge of the first tap A of the pixel 54 in the corresponding pixel column is output to the signal line $VSL_1$ of the two signal lines $VSL_1$ and $VSL_2$. Furthermore, an analog pixel signal $AIN_{P2}$ based on charge of the second tap B of the pixel 54 in the corresponding pixel column is output to the signal line $VSL_2$. The analog pixel signals $AIN_{P1}$ and $AIN_{P2}$ will be described later.

On the circuit chip 52, a row selection unit 55, a column signal processing unit 56, an output circuit unit 57, and a timing control unit 58 are disposed. The row selection unit 55 drives each pixel 54 of the pixel array unit 53 in units of pixel rows and outputs the pixel signals $AIN_{P1}$ and $AIN_{P2}$. Under the driving by the row selection unit 55, the analog pixel signals $AIN_{P1}$ and $AIN_{P2}$ output from the pixels 54 in selected rows are supplied to the column signal processing unit 56 through the two signal lines $VSL_1$ and $VSL_2$.

The column signal processing unit 56 includes a plurality of analog-to-digital converters (ADC) 59 provided in correspondence with the pixel columns (for example, for each pixel column) of the pixel array unit 53. The analog-to-digital converter 59 performs analog-to-digital conversion processing on the analog pixel signals $AIN_{P1}$ and $AIN_{P2}$ supplied through the signal lines $VSL_1$ and $VSL_2$, and outputs the pixel signals $AIN_{P1}$ and $AIN_{P2}$ to the output circuit unit 57. The output circuit unit 57 performs predetermined signal processing on the digitized pixel signals $AIN_{P1}$ and $AIN_{P2}$ output from the column signal processing unit 56, and outputs the pixel signals $AIN_{P1}$ and $AIN_{P2}$ to outside of the circuit chip 52.

The timing control unit 58 generates various timing signals, clock signals, control signals, and the like, and performs drive control of the row selection unit 55, the column signal processing unit 56, the output circuit unit 57, and the like on the basis of the signals.

[Example of Circuit Configuration of Pixel]

Figure 16:
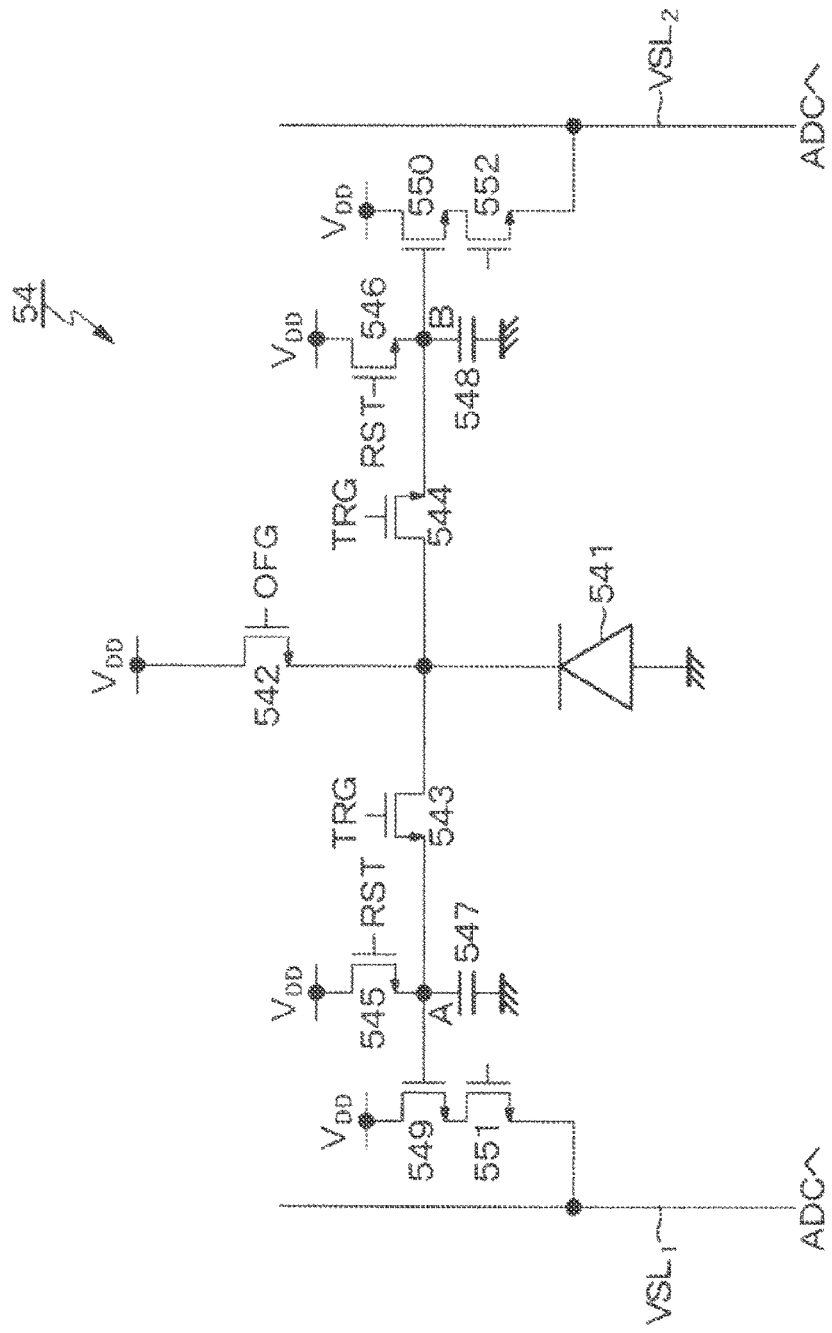
FIG. 16 is a circuit diagram depicting an example of a circuit configuration of a pixel in the indirect TOF distance image sensor according to the second embodiment.

FIG. 16 is a circuit diagram depicting an example of a circuit configuration of the pixel 54 in the indirect TOF distance image sensor 50 according to the second embodiment.

The pixel 54 of the present example includes, for example, a photodiode 541 as a photoelectric conversion element. In addition to the photodiode 541, the pixel 54 includes an overflow transistor 542, two transfer transistors 543 and 544, two reset transistors 545 and 546, two floating diffusion layers 547 and 548, two amplification transistors 549 and 550, and two selection transistors 551 and 552. The two floating diffusion layers 547 and 548 correspond to the first and second taps A and B (which may be hereinafter simply described as "taps A and B") illustrated in FIG. 15.

The photodiode 541 photoelectrically converts received light to generate a charge. The photodiode 541 can have, for example, a back surface irradiation type pixel structure. However, the structure is not limited to the back surface irradiation type structure, and may be a front surface irradiation type structure that captures light emitted from a side of a substrate front surface.

The overflow transistor 542 is connected between a cathode electrode of the photodiode 541 and a power line of the power supply voltage $V_{DD}$, and has a function of resetting the photodiode 541. Specifically, the overflow transistor 542 becomes conductive in response to an overflow gate signal TRG supplied from the row selection unit 55, and thus sequentially transfers charges generated in the photodiode 541 to the floating diffusion layers 547 and 548.

The floating diffusion layers 547 and 548 corresponding to the first and second taps A and B accumulate the charge transferred from the photodiode 541, convert the charge into a voltage signal having a voltage value corresponding to an amount of the charge, and generate the pixel signals $AIN_{P1}$ and $AIN_{P2}$.

The two reset transistors 545 and 546 are respectively connected between the two floating diffusion layers 547 and 548 and the power line of the power supply voltage $V_{DD}$. Then, the reset transistors 545 and 546 become conductive in response to the reset signal RST supplied from the row selection unit 55, and thus extract the charge from the floating diffusion layers 347 and 348, respectively, and initialize the charge amount.

The two amplification transistors 549 and 550 are connected between the power line of the power supply voltage $V_{DD}$ and the two selection transistors 551 and 552, respectively, and amplify voltage signals converted from charges to voltages in the floating diffusion layers 547 and 548, respectively.

The two selection transistors 551 and 552 are connected between the two amplification transistors 549 and 550 and the signal lines $VSL_1$ and $VSL_2$, respectively. Then, the selection transistors 551 and 552 become conductive in response to the selection signal SEL supplied from the row selection unit 55, and thus output voltage signals amplified by the amplification transistors 549 and 550, respectively, to the two signal lines $VSL_1$ and $VSL_2$ as the analog pixel signals $AIN_{P1}$ and $AIN_{P2}$.

The two signal lines $VSL_1$ and $VSL_2$ are connected to an input end of one analog-to-digital converter 59 in the column signal processing unit 56 for each pixel column, and transmit the analog pixel signals $AIN_{P1}$ and $AIN_{P2}$ output from the pixels 54 for each pixel column to the analog-to-digital converter 59.

Note that the circuit configuration of the pixel 54 is not limited to the circuit configuration exemplified in FIG. 16 as long as the circuit configuration can generate the analog pixel signals $AIN_{P1}$ and $AIN_{P2}$ by photoelectric conversion.

In the indirect TOF distance image sensor 50 having a configuration described above, the technology according to the present disclosure can be applied to the column signal processing unit 56 including the analog-to-digital converter 59. Specifically, as the column signal processing unit 56 including the analog-to-digital converter 59, similarly to a case in the first embodiment, the column signal processing system according to the first embodiment, the second embodiment, the third embodiment, or the fourth embodiment including the column amplifier unit 14, the capacitance unit 19, and the successive approximation register analog-to-digital conversion unit 15A can be used.

<Modification>

Although the technology according to the present disclosure has been described above on the basis of the preferred embodiments, the technology according to the present disclosure is not limited to the embodiments. The configurations and structures of the CMOS image sensor and the indirect TOF distance image sensor illustrated in the embodiments described above are examples, and can be changed as appropriate.

APPLICATION EXAMPLES

Figure 17:
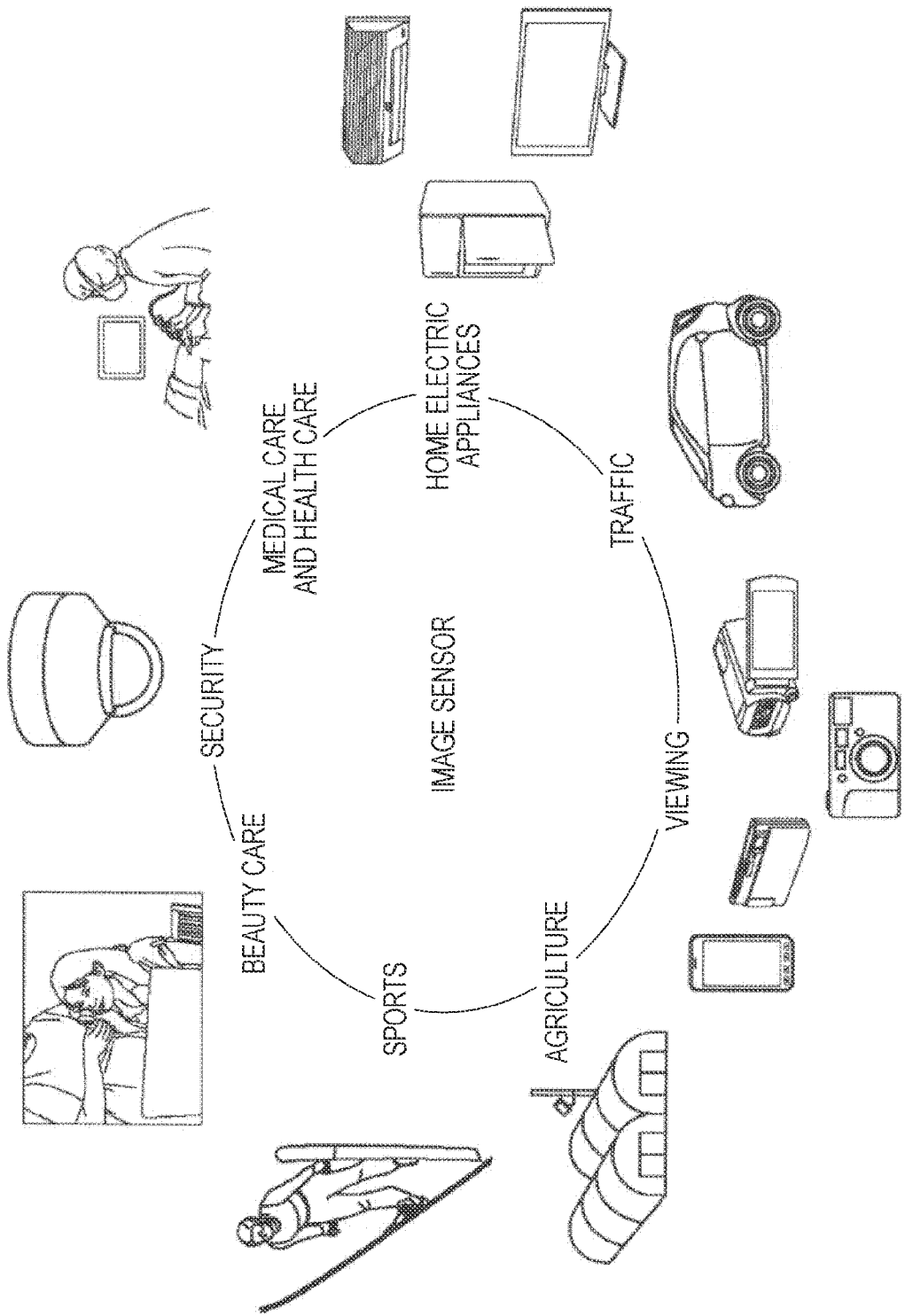
FIG. 17 is a diagram illustrating an application example of the technology according to the present disclosure.

The imaging apparatus (CMOS image sensor) according to the first embodiment can be used for various devices that sense light such as visible light, infrared light, ultraviolet light, X-ray, and the like as illustrated in FIG. 17, for example. Specific examples of such various devices are listed below.

A device that captures an image to be used for viewing, such as a digital camera, a portable device with a camera function, and the like.

A device used for traffic, such as an in-vehicle sensor that captures images of the front, rear, surroundings, inside, and the like of an automobile for safe driving such as automatic stop, recognition of a driver's condition, and the like, a monitoring camera that monitors traveling vehicles and roads, and a ranging sensor that measures a distance between vehicles and the like.

A device used for home electric appliances such as a TV, a refrigerator, an air conditioner, and the like in order to capture an image of a gesture of a user and perform a device operation according to the gesture.

A device used for medical care and health care, such as an endoscope, a device that performs angiography by receiving infrared light, and the like.

A device used for security, such as a monitoring camera for crime prevention, a camera for person authentication, and the like.

A device used for beauty care, such as a skin measuring instrument for capturing an image of skin, a microscope for capturing an image of scalp, and the like.

An apparatus used for sports, such as an action camera or a wearable camera for sports or the like.

A device used for agriculture, such as a camera for monitoring conditions of fields and crops, and the like.

Application Example of Technology According to Present Disclosure

The technology according to the present disclosure can be applied to various products. Hereinafter, a more specific application example will be described.

[Electronic Device of Present Disclosure]

Here, description will be made of a case where the technology according to the present disclosure is applied to an imaging system such as a digital still camera, a video camera, or the like, a mobile terminal device having an imaging function, such as a mobile phone or the like, or an electronic device such as a copier using an imaging apparatus as an image reader.

(Example of Imaging System)

Figure 18:
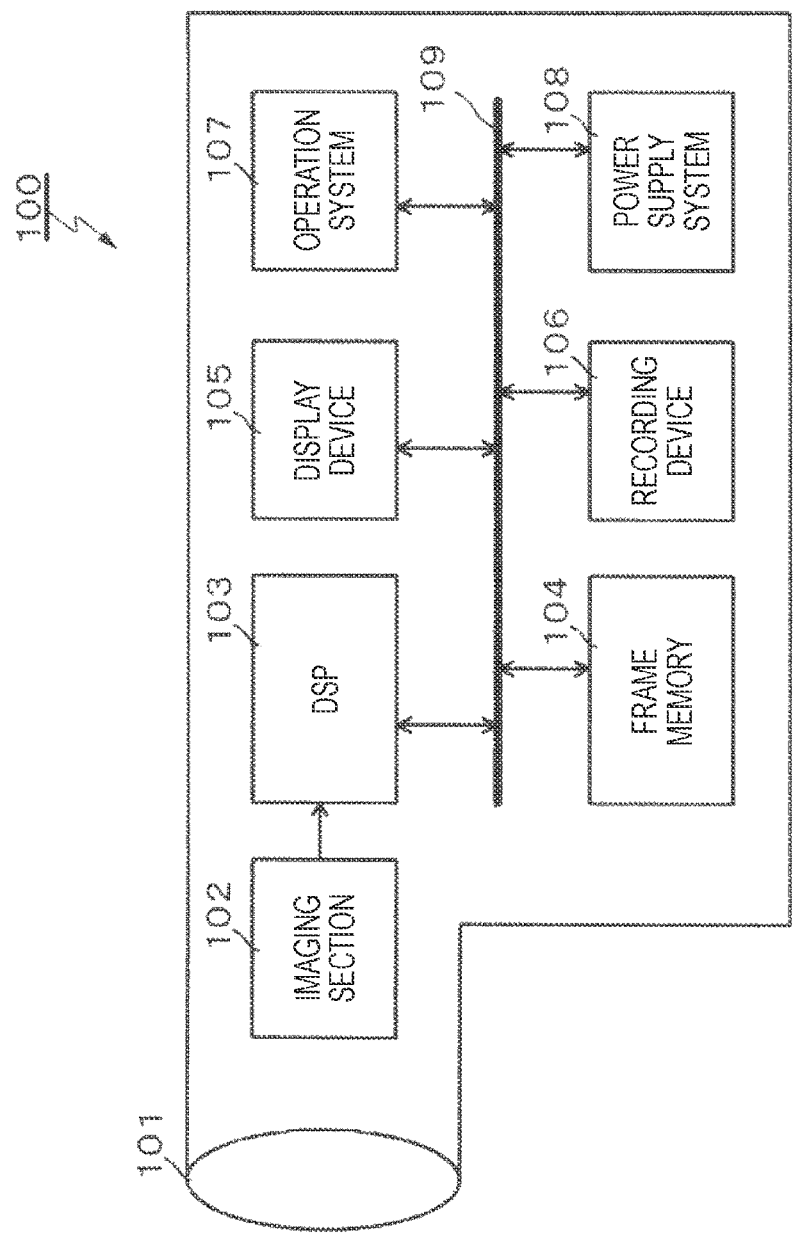
FIG. 18 is a block diagram depicting an outline of a configuration example of an imaging system as an example of an electronic device of the present disclosure.

FIG. 18 is a block diagram depicting a configuration example of an imaging system as an example of an electronic device of the present disclosure.

As illustrated in FIG. 18, an imaging system 100 of the present example includes an imaging optical system 101 including a lens group and the like, an imaging section 102, a digital signal processor (DSP) circuit 103, a frame memory 104, a display device 105, a recording device 106, an operation system 107, a power supply system 108, and the like. Then, the DSP circuit 103, the frame memory 104, the display device 105, the recording device 106, the operation system 107, and the power supply system 108 are connected to one another via a bus line 109.

The imaging optical system 101 captures incident light (image light) from a subject and forms an image on an imaging surface of the imaging section 102. The imaging section 102 converts a light amount of the incident light from which an image has been formed on the imaging surface by the optical system 101 into an electric signal for each pixel and outputs the electric signal as a pixel signal. The DSP circuit 103 performs general camera signal processing, such as white balance processing, demosaic processing, gamma correction processing, and the like, for example.

The frame memory 104 is appropriately used for storing data in the process of signal processing in the DSP circuit 103. The display device 105 includes a panel display device such as a liquid crystal display device, an organic electro luminescence (EL) display device, or the like and displays a moving image or a still image captured by the imaging section 102. The recording device 106 records the moving image or the still image captured by the imaging section 102 on a recording medium such as a portable semiconductor memory, an optical disk, a hard disk drive (HDD), or the like.

The operation system 107 issues operation commands for various functions of the imaging apparatus 100 in response to operation of a user. The power supply system 108 appropriately supplies various power supplies serving as operation power supply of the DSP circuit 103, the frame memory 104, the display device 105, the recording device 106, and the operation system 107 to these supply targets.

In the imaging system 100 having a configuration described above, the imaging apparatus according to the first embodiment described above can be used as the imaging section 102. In the imaging apparatus according to the first embodiment, in particular, the successive approximation register analog-to-digital converter is excellent in power efficiency, and thus using the imaging apparatus as the imaging section 102 can contribute to lower power consumption of the imaging system 100.

[Example of Application to Mobile Body]

The technology according to the present disclosure (the present technology) can be applied to various products. For example, the technology according to the present disclosure may be achieved as an imaging apparatus mounted on any type of mobile body such as an automobile, an electric vehicle, a hybrid electric vehicle, a motorcycle, a bicycle, a personal mobility, an airplane, a drone, a ship, a robot, a construction machine, an agricultural machine (tractor), or the like.

Figure 19:
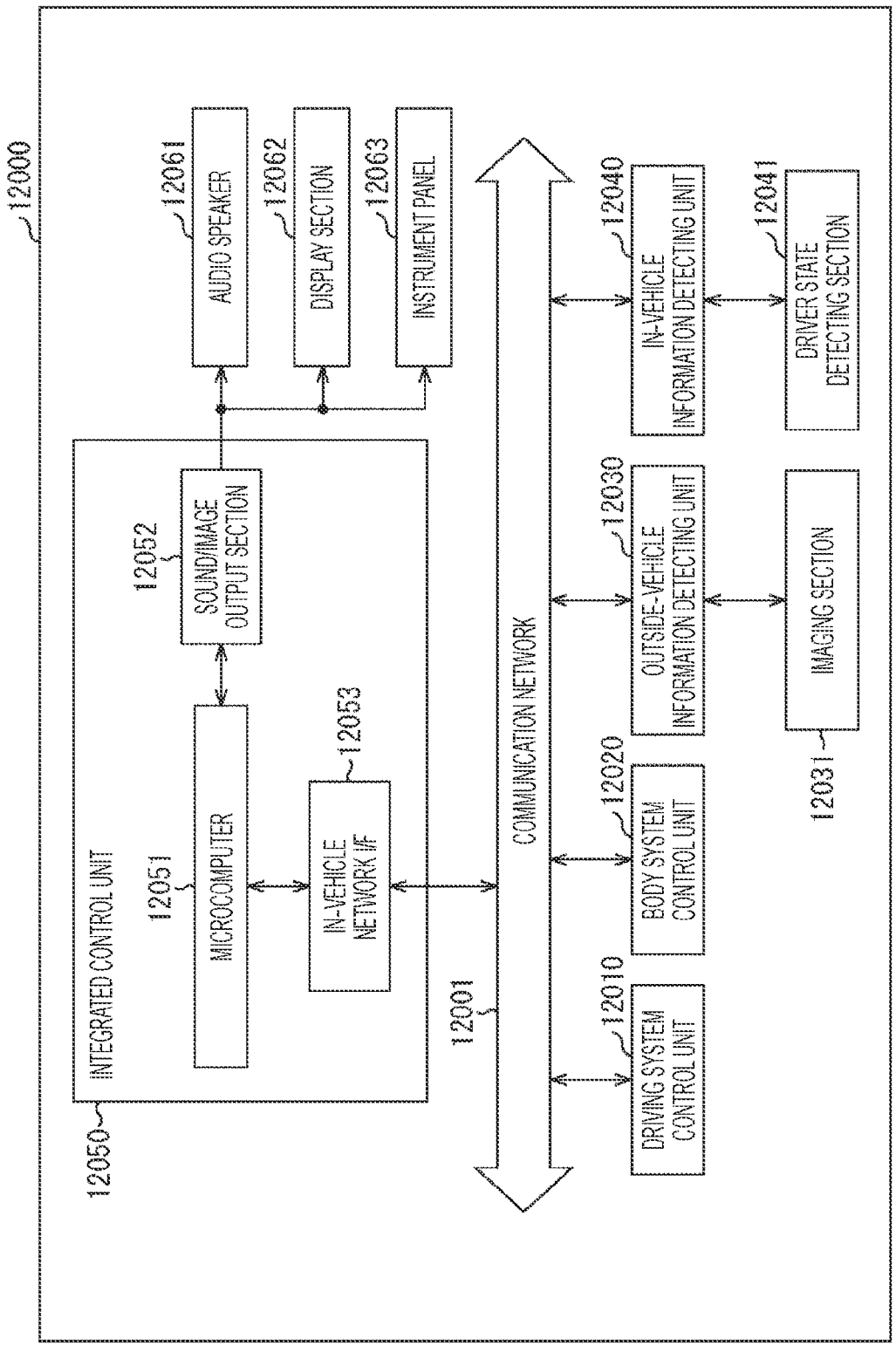
FIG. 19 is a block diagram depicting an example of a schematic configuration of a vehicle control system as an example of a mobile body control system to which the technology according to the present disclosure can be applied.

FIG. 19 is a block diagram depicting an example of a schematic configuration of a vehicle control system as an example of a mobile body control system to which the technology according to the present disclosure can be applied.

A vehicle control system 12000 includes a plurality of electronic control units connected to each other via a communication network 12001. In an example depicted in FIG. 19, the vehicle control system 12000 includes a driving system control unit 12010, a body system control unit 12020, an outside-vehicle information detecting unit 12030, an in-vehicle information detecting unit 12040, and an integrated control unit 12050. Furthermore, as a functional configuration of the integrated control unit 12050, a microcomputer 12051, a sound/image output section 12052, and an in-vehicle network interface (I/F) 12053 are illustrated.

The driving system control unit 12010 controls operation of devices related to a driving system of a vehicle in accordance with various kinds of programs. For example, the driving system control unit 12010 functions as a control device for a driving force generating device that generates a driving force of the vehicle, such as an internal combustion engine, a driving motor, or the like, a driving force transmitting mechanism that transmits a driving force to wheels, a steering mechanism that adjusts a steering angle of the vehicle, a braking device that generates a braking force of the vehicle, and the like.

The body system control unit 12020 controls operation of various kinds of devices provided in the vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle equipped with the vehicle control system 12000. For example, an imaging section 12031 is connected to the outside-vehicle information detecting unit 12030. The outside-vehicle information detecting unit 12030 makes the imaging section 12031 capture an image of the outside of the vehicle, and receives the captured image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light and outputs an electric signal corresponding to an amount of the received light. The imaging section 12031 can output the electric signal as an image or as distance measurement information. Furthermore, the light received by the imaging section 12031 may be visible light or invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041 may include a camera imaging a driver, for example. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of in-vehicle and outside-vehicle information obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which include collision avoidance or shock mitigation for the vehicle, following driving based on a following distance, vehicle speed maintaining driving, a warning of collision of the vehicle, a warning of deviation of the vehicle from a lane, and the like.

In addition, the microcomputer 12051 can perform cooperative control intended for automated driving, which makes the vehicle to travel automatically without depending on the operation of the driver, or the like, by controlling the driving force generating device, the steering mechanism, the braking device, or the like on the basis of the information about the surroundings of the vehicle, obtained by the outside-vehicle information detecting unit 12030 or the in-vehicle information detecting unit 12040.

Furthermore, the microcomputer 12051 can output a control command to the body system control unit 12020 on the basis of the outside-vehicle information obtained by the outside-vehicle information detecting unit 12030. For example, the microcomputer 12051 can perform cooperative control for the purpose of preventing glare, such as switching from a high beam to a low beam or the like, by controlling a headlamp in accordance with a position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In an example in FIG. 19, an audio speaker 12061, a display section 12062, and an instrument panel 12063 are illustrated as the output device. The display section 12062 may, for example, include at least one of an on-board display or a head-up display.

Figure 20:
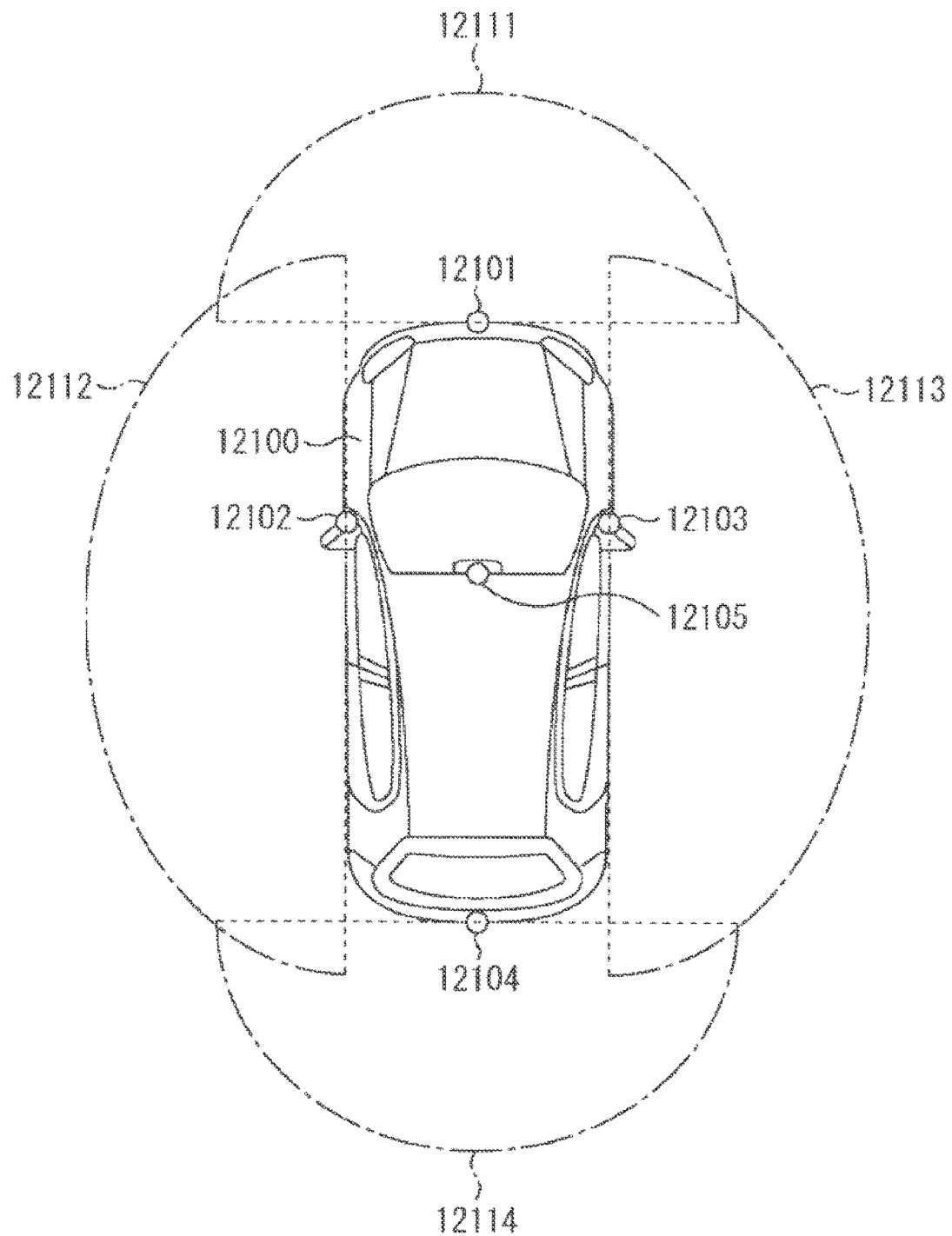
FIG. 20 is a diagram depicting an example of an installation position of an imaging section in the mobile body control system.

FIG. 20 is a diagram depicting an example of an installation position of the imaging section 12031.

In FIG. 20, a vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100, a position on an upper portion of a windshield within the interior of the vehicle, and the like. The imaging section 12101 provided at the front nose and the imaging section 12105 provided at the upper portion of the windshield within the interior of the vehicle obtain mainly an image of the front of the vehicle 12100. The imaging sections 12102 and 12103 provided on the sideview mirrors obtain mainly an image of the sides of the vehicle 12100. The imaging section 12104 provided on the rear bumper or the back door obtains mainly an image of the rear of the vehicle 12100. The image of the front obtained by the imaging sections 12101 and 12105 is used mainly to detect a preceding vehicle, a pedestrian, an obstacle, a signal, a traffic sign, a lane, or the like.

Note that FIG. 20 illustrates an example of photographing ranges of the imaging sections 12101 to 12104. An imaging range 12111 represents the imaging range of the imaging section 12101 provided on the front nose. Imaging ranges 12112 and 12113 respectively represent the imaging ranges of the imaging sections 12102 and 12103 provided to the sideview mirrors. An imaging range 12114 represents the imaging range of the imaging section 12104 provided on the rear bumper or the back door. A bird's-eye image of the vehicle 12100 as viewed from above can be obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera including a plurality of imaging apparatuses, or may be an imaging device having pixels for phase difference detection.

For example, the microcomputer 12051 obtains a distance to each three-dimensional object in the imaging ranges 12111 to 12114 and a temporal change of the distance (relative speed with respect to the vehicle 12100) on the basis of the distance information obtained from the imaging sections 12101 to 12104, and thus can extract, as a preceding vehicle, a three-dimensional object traveling at a predetermined speed (for example, 0 km/h or more) in substantially the same direction as the vehicle 12100, in particular, the closest three-dimensional object on a traveling path of the vehicle 12100. Moreover, the microcomputer 12051 can set a following distance to be secured in advance in front of the preceding vehicle, and can perform automatic brake control (including following stop control), automatic acceleration control (including following start control), and the like. As described above, it is possible to perform cooperative control for the purpose of automated driving or the like in which the vehicle automatically travels without depending on the operation of the driver.

For example, on the basis of the distance information obtained from the imaging sections 12101 to 12104, the microcomputer 12051 can classify three-dimensional object data regarding three-dimensional objects into two-wheeled vehicles, ordinary vehicles, large vehicles, pedestrians, and other three-dimensional objects such as utility poles and the like, extract the three-dimensional object data, and use the three-dimensional object data for automatic avoidance of obstacles. For example, the microcomputer 12051 identifies obstacles around the vehicle 12100 as obstacles that can be visually recognized by the driver of the vehicle 12100 and obstacles that are difficult to visually recognize. Then, the microcomputer 12051 determines a collision risk indicating a risk of collision with each obstacle. When the collision risk is a set value or more and there is a possibility of collision, the microcomputer can perform driving assistance for collision avoidance by outputting an alarm to the driver via the audio speaker 12061 or the display section 12062 or performing forced deceleration or avoidance steering via the driving system control unit 12010.

At least one of the imaging sections 12101 to 12104 may be an infrared camera that detects infrared rays. For example, the microcomputer 12051 can recognize a pedestrian by determining whether or not a pedestrian is present in the images captured by the imaging sections 12101 to 12104. Such recognition of a pedestrian is performed by, for example, a procedure of extracting feature points in the images captured by the imaging sections 12101 to 12104 as infrared cameras, and a procedure of performing pattern matching processing on a series of feature points indicating an outline of an object to determine whether or not the object is a pedestrian. When the microcomputer 12051 determines that a pedestrian is present in the images captured by the imaging sections 12101 to 12104 and recognizes the pedestrian, the sound/image output section 12052 controls the display section 12062 to superimpose and display a rectangular contour line for emphasis on the recognized pedestrian. Furthermore, the sound/image output section 12052 may control the display section 12062 to display an icon or the like indicating a pedestrian at a desired position.

An example of the vehicle control system to which the technology according to the present disclosure can be applied has been described above. The technology according to the present disclosure can be applied to, for example, imaging sections 7910, 7912, 7914, 7916, and 7918 and outside-vehicle information detecting sections 7920, 7922, 7924, 7926, 7928, and 7930 among the above-described configurations. Then, in particular, the successive approximation register analog-to-digital converter is excellent in power efficiency, and thus application of the technology according to the present disclosure can contribute to lower power consumption of the vehicle control system.

<Employable Configurations in Present Disclosure>

Note that the present disclosure can also employ the following configurations.

<<A. Imaging Apparatus>>

[A-01] An imaging apparatus including:
  a pixel array unit on which pixels including a photoelectric conversion element are arranged;
  a column amplifier unit that obtains a difference between a reset component and a signal component input from each of the pixels of the pixel array unit through a signal line and outputs the difference as a pixel signal;
  a capacitance unit that holds the pixel signal input from the column amplifier unit; and
  a successive approximation register analog-to-digital conversion unit that converts an analog signal input from the capacitance unit into a digital signal.

[A-02] The imaging apparatus according to [A-01] described above, in which
  the column amplifier unit includes
    an amplifier to which a potential of the signal line is input to a non-inverting input terminal,
    a first switch having one end connected to an output terminal of the amplifier and another end connected to an inverting input terminal of the amplifier,
    a second switch having one end connected to an output terminal of the amplifier,
    a first capacitive element having one end connected to another end of the second switch and another end connected to the another end of the first switch and the inverting input terminal of the amplifier,
    a second capacitive element connected between the another end of the first capacitive element and the inverting input terminal of the amplifier and a base potential node, and
    a third switch having one end connected to the another end of the second switch and the one end of the first capacitive element, the third switch having another end to which a local base voltage is applied.

[A-03] The imaging apparatus according to [A-02] described above, in which
  in the column amplifier unit,
    when the reset component is input, the first switch is set to a closed state to charge the reset component to the first capacitive element and the second capacitive element, and the third switch is set to a closed state to take in the local base voltage,
    next, the first switch and the third switch are set to an open state, the second switch is set to a closed state, and a non-inverting amplifier circuit is configured by the first capacitive element, the second capacitive element, and the amplifier, and
    when the signal component is input, feedback is applied for a voltage at a common connection node between the first capacitive element and the second capacitive element to be identical to a voltage of the signal component.

[A-04] The imaging apparatus according to any of [A-01] to [A-03] described above, in which
  for one successive approximation register analog-to-digital converter of the successive approximation register analog-to-digital conversion unit, potentials of a plurality of the signal lines are each multiplexed and processed through a plurality of column amplifiers corresponding to the plurality of signal lines and the capacitance unit.

[A-05] The imaging apparatus according to [A-04] described above, in which
  the successive approximation register analog-to-digital converter performs conversion processing only when the reset component is input, and stands by when the signal component is input.

[A-06] The imaging apparatus according to [A-04] described above, in which
  the successive approximation register analog-to-digital converter performs conversion processing not only when the reset component is input but also when the signal component is input.

[A-07] The imaging apparatus according to [A-06] described above, in which
  the potentials of the plurality of signal lines are divided into potentials of two systems of signal lines,
  the capacitance unit includes three capacitive elements, and
  the three capacitive elements of the capacitive unit are evenly used for the potentials of the two systems of signal lines.

[A-08] The imaging apparatus according to [A-06] described above, in which
in a column signal processing system including the column amplifier unit, the capacitance unit, and the successive approximation register analog-to-digital conversion unit, the capacitance unit and subsequent portions have a configuration of a differential circuit.

[A-09] The imaging apparatus according to [A-08] described above, in which
each of the column amplifiers of the column amplifier unit includes a current reuse column amplifier that performs voltage amplification by using a bias current of each of the signal lines.

[A-10] The imaging apparatus according to any of [A-01] to [A-09] described above, in which
the capacitance unit includes a capacitance multiplexer.

[A-11] The imaging apparatus according to [A-10] described above, in which
the capacitance unit holds the pixel signal by sampling with a switched capacitor.

<<B. Electronic Device>>

[B-01] An electronic device including an imaging apparatus including
a pixel array unit on which pixels including a photoelectric conversion element are arranged,
a column amplifier unit that obtains a difference between a reset component and a signal component input from each of the pixels of the pixel array unit through a signal line and outputs the difference as a pixel signal,
a capacitance unit that holds the pixel signal input from the column amplifier unit, and
a successive approximation register analog-to-digital conversion unit that converts an analog signal input from the capacitance unit into a digital signal.

[B-02] The electronic device according to [B-01] described above, in which
the column amplifier unit includes
an amplifier to which a potential of the signal line is input to a non-inverting input terminal,
a first switch having one end connected to an output terminal of the amplifier and another end connected to an inverting input terminal of the amplifier,
a second switch having one end connected to an output terminal of the amplifier,
a first capacitive element having one end connected to the another end of the second switch and another end connected to the another end of the first switch and the inverting input terminal of the amplifier,
a second capacitive element connected between the another end of the first capacitive element and the inverting input terminal of the amplifier and a base potential node, and
a third switch having one end connected to the another end of the second switch and the one end of the first capacitive element, the third switch having another end to which a local base voltage is applied.

[B-03] The electronic device according to [B-02] described above, in which
in the column amplifier unit,
when the reset component is input, the first switch is set to a closed state to charge the reset component to the first capacitive element and the second capacitive element, and the third switch is set to a closed state to take in the local base voltage,
next, the first switch and the third switch are set to an open state, the second switch is set to a closed state, and a non-inverting amplifier circuit is configured by the first capacitive element, the second capacitive element, and the amplifier, and
when the signal component is input, feedback is applied for a voltage at a common connection node between the first capacitive element and the second capacitive element to be identical to a voltage of the signal component.

[B-04] The electronic device according to any of [B-01] to [B-03] described above, in which
for one successive approximation register analog-to-digital converter of the successive approximation register analog-to-digital conversion unit, potentials of a plurality of the signal lines are each multiplexed and processed through a plurality of column amplifiers corresponding to the plurality of signal lines and the capacitance unit.

[B-05] The electronic device according to [B-04] described above, in which
the successive approximation register analog-to-digital converter performs conversion processing only when the reset component is input, and stands by when the signal component is input.

[B-06] The electronic device according to [B-04] described above, in which
the successive approximation register analog-to-digital converter performs conversion processing not only when the reset component is input but also when the signal component is input.

[B-07] The electronic device according to [B-06] described above, in which
the potentials of the plurality of signal lines are divided into potentials of two systems of signal lines,
the capacitance unit includes three capacitive elements, and
the three capacitive elements of the capacitance unit are evenly used for the potentials of the two systems of signal lines.

[B-08] The electronic device according to [B-06] described above, in which
in a column signal processing system including the column amplifier unit, the capacitance unit, and the successive approximation register analog-to-digital conversion unit, the capacitance unit and subsequent portions have a configuration of a differential circuit.

[B-09] The electronic device according to [B-08] described above, in which
each of the column amplifiers of the column amplifier unit includes a current reuse column amplifier that performs voltage amplification by using a bias current of each of the signal lines.

[B-10] The electronic device according to any of [B-01] to [B-09] described above, in which
the capacitance unit includes a capacitance multiplexer.

[B-11] The electronic device according to [B-10] described above, in which
the capacitance unit holds the pixel signal by sampling with a switched capacitor.

REFERENCE SIGNS LIST

10 CMOS image sensor
11 Pixel array unit
12 Row selection unit
13 Constant current source unit
14 Column amplifier unit
Analog-to-digital conversion unit 15A Successive approximation register analog-to-digital conversion unit
16 Horizontal transfer scanning unit
17 Signal processing unit
18 Timing control unit
19 Capacitance unit
20 Pixel (pixel circuit)
21 Photodiode (photoelectric conversion element)
22 Transfer transistor
23 Reset transistor
24 Amplification transistor
25 Selection transistor
31 ($31_1$ to $31_m$) Pixel control line
32 ($32_1$ to $32_n$) Signal line
50 Indirect TOF distance image sensor
60 Light source
100 Imaging system
140 Column amplifier
150 Successive approximation register analog-to-digital converter
160 Base voltage generation unit
190 Capacitance multiplexer
1400 Current reuse column amplifier (CRCA)
VR Local base voltage
$V_{CM}$ Output common mode reference voltage

The invention claimed is:

1. An imaging apparatus comprising:
a plurality of pixels respectively including a photoelectric conversion element;
a column amplifier circuit that obtains a difference between a reset component and a signal component input from each of the pixels through a signal line and outputs the difference as a pixel signal;
a capacitance circuit that holds the pixel signal input from the column amplifier circuit; and
a successive approximation register analog-to-digital conversion circuit that converts an analog signal input from the capacitance circuit into a digital signal.

2. The imaging apparatus according to claim 1, wherein the column amplifier circuit includes
an amplifier to which a potential of the signal line is input to a non-inverting input terminal,
a first switch having one end connected to an output terminal of the amplifier and another end connected to an inverting input terminal of the amplifier,
a second switch having one end connected to an output terminal of the amplifier,
a first capacitive element having one end connected to another end of the second switch and another end connected to the another end of the first switch and the inverting input terminal of the amplifier,
a second capacitive element connected between the another end of the first capacitive element and the inverting input terminal of the amplifier and a base potential node, and
a third switch having one end connected to the another end of the second switch and the one end of the first capacitive element, the third switch having another end to which a local base voltage is applied.

3. The imaging apparatus according to claim 2, wherein in the column amplifier circuit,
when the reset component is input, the first switch is set to a closed state to charge the reset component to the first capacitive element and the second capacitive element, and the third switch is set to a closed state to take in the local base voltage,
next, the first switch and the third switch are set to an open state, the second switch is set to a closed state, and a non-inverting amplifier circuit is configured by the first capacitive element, the second capacitive element, and the amplifier, and
when the signal component is input, feedback is applied for a voltage at a common connection node between the first capacitive element and the second capacitive element to be identical to a voltage of the signal component.

4. The imaging apparatus according to claim 1, wherein for one successive approximation register analog-to-digital converter of the successive approximation register analog-to-digital conversion circuit, potentials of a plurality of the signal lines are each multiplexed and processed through a plurality of column amplifiers corresponding to the plurality of signal lines and the capacitance circuit.

5. The imaging apparatus according to claim 4, wherein the successive approximation register analog-to-digital conversion circuit performs conversion processing only when the reset component is input, and stands by when the signal component is input.

6. The imaging apparatus according to claim 4, wherein the successive approximation register analog-to-digital conversion circuit performs conversion processing not only when the reset component is input but also when the signal component is input.

7. The imaging apparatus according to claim 6, wherein the potentials of the plurality of signal lines are divided into potentials of two systems of signal lines,
the capacitance circuit includes three capacitive elements, and
the three capacitive elements of the capacitance circuit are evenly used for the potentials of the two systems of signal lines.

8. The imaging apparatus according to claim 6, wherein in a column signal processing system including the column amplifier circuit, the capacitance circuit, and the successive approximation register analog-to-digital conversion circuit, the capacitance circuit and subsequent portions have a configuration of a differential circuit.

9. The imaging apparatus according to claim 8, wherein each of the column amplifiers of the column amplifier circuit includes a current reuse column amplifier that performs voltage amplification by using a bias current of each of the signal lines.

10. The imaging apparatus according to claim 1, wherein the capacitance circuit includes a capacitance multiplexer.

11. The imaging apparatus according to claim 10, wherein the capacitance circuit holds the pixel signal by sampling with a switched capacitor.

12. An electronic device comprising an imaging apparatus including
a plurality of pixels respectively including a photoelectric conversion element,
a column amplifier circuit that obtains a difference between a reset component and a signal component input from each of the pixels through a signal line and outputs the difference as a pixel signal,
a capacitance circuit that holds the pixel signal input from the column amplifier circuit, and
a successive approximation register analog-to-digital conversion circuit that converts an analog signal input from the capacitance circuit into a digital signal.

13. The electronic device according to claim 12, wherein the column amplifier circuit includes an amplifier to which a potential of the signal line is input to a non-inverting input terminal, a first switch having one end connected to an output terminal of the amplifier and another end connected to an inverting input terminal of the amplifier, a second switch having one end connected to an output terminal of the amplifier, a first capacitive element having one end connected to another end of the second switch and another end connected to the another end of the first switch and the inverting input terminal of the amplifier, a second capacitive element connected between the another end of the first capacitive element and the inverting input terminal of the amplifier and a base potential node, and a third switch having one end connected to the another end of the second switch and the one end of the first capacitive element, the third switch having another end to which a local base voltage is applied.

14. The electronic device according to claim 13, wherein in the column amplifier circuit, when the reset component is input, the first switch is set to a closed state to charge the reset component to the first capacitive element and the second capacitive element, and the third switch is set to a closed state to take in the local base voltage, next, the first switch and the third switch are set to an open state, the second switch is set to a closed state, and a non-inverting amplifier circuit is configured by the first capacitive element, the second capacitive element, and the amplifier, and when the signal component is input, feedback is applied for a voltage at a common connection node between the first capacitive element and the second capacitive element to be identical to a voltage of the signal component.

15. The electronic device according to claim 12, wherein for one successive approximation register analog-to-digital converter of the successive approximation register analog-to-digital conversion circuit, potentials of a plurality of the signal lines are each multiplexed and processed through a plurality of column amplifiers corresponding to the plurality of signal lines and the capacitance circuit.

16. The electronic device according to claim 15, wherein the successive approximation register analog-to-digital conversion circuit performs conversion processing only when the reset component is input, and stands by when the signal component is input.

17. The electronic device according to claim 15, wherein the successive approximation register analog-to-digital conversion circuit performs conversion processing not only when the reset component is input but also when the signal component is input.

18. The electronic device according to claim 17, wherein
the potentials of the plurality of signal lines are divided into potentials of two systems of signal lines,
the capacitance circuit includes three capacitive elements, and
the three capacitive elements of the capacitance circuit are evenly used for the potentials of the two systems of signal lines.

19. The electronic device according to claim 17, wherein in a column signal processing system including the column amplifier circuit, the capacitance circuit, and the successive approximation register analog-to-digital conversion circuit, the capacitance circuit and subsequent portions have a configuration of a differential circuit.

20. The electronic device according to claim 19, wherein each of the column amplifiers of the column amplifier circuit includes a current reuse column amplifier that performs voltage amplification by using a bias current of each of the signal lines.

21. The electronic device according to claim 12, wherein the capacitance circuit includes a capacitance multiplexer.

22. The electronic device according to claim 21, wherein the capacitance circuit holds the pixel signal by sampling with a switched capacitor.

* * * * *